United States Patent [19]

Catalano

[11] Patent Number: 5,375,318
[45] Date of Patent: Dec. 27, 1994

[54] CIRCUIT BOARD COMPONENT SHEARING MACHINE

[75] Inventor: Donald Catalano, Patterson, Calif.

[73] Assignee: Gary W. Catalano, Santa Clara, Calif.; a part interest

[21] Appl. No.: 18,078

[22] Filed: Feb. 17, 1993

[51] Int. Cl.5 .............................................. B23P 19/04
[52] U.S. Cl. ...................................... 29/762; 29/239; 83/870
[58] Field of Search ................. 29/762, 239, DIG. 86; 83/861, 870

[56] References Cited

U.S. PATENT DOCUMENTS

| | | | |
|---|---|---|---|
| 3,991,459 | 11/1976 | Rapp | 29/762 X |
| 4,586,252 | 5/1986 | Faticanti | 29/762 |
| 5,093,984 | 3/1992 | Lope | 29/762 X |
| 5,214,849 | 6/1993 | Jones, Jr. | 29/762 |
| 5,216,803 | 6/1993 | Nolan et al. | 29/762 X |

*Primary Examiner*—Rinaldi I. Rada
*Attorney, Agent, or Firm*—David E. Newhouse

[57] ABSTRACT

A hydraulic machine for shearing leads, connectors and other components from printed circuit (PC) boards includes a frame supporting (i) a carriage slideable on inclined parallel rails carrying a shear blade, (ii) a jacking platform providing a flat surface parallel the rails moveable perpendicularly, (iii) an anvil located beyond lower end of the rails having a planer face with a horizontal notch for capturing an edge of and supporting a PC board laid flatly on the jacking platform, and (iv) a plurality of normally retracted, pneumatically energized, clamping pistons translatable perpendicularly toward the jacking platform securing the PC board against the jacking platform preventing it from bending and buckling as the shear blade carried by the sliding carriage chisels components from the board's surface. The sliding carriage and the jacking platform are hydraulically reciprocated within the frame respectively by separate hydraulic circulation loops supplied from a common pump source. The shear blade presents a chisel edge establishing the shearing plane of the machine and an inclined top surface. A plurality of proximity switches are positioned adjacent the rails carrying the shear carriage for sequentially triggering release of the pneumatic clamping piston as the shear carriage slides down the inclined rails. A plurality vertical notches are cut into the engagement surface of the anvil and into the adjacent section of the jacking platform to provide a plurality of channels or holes for allowing debris sheared off the surface of a PC board, sliding and falling toward the anvil to drop into a collection bin located below the anvil and jacking platform. Protective walls shield operators and loaders from flying components sheared from the boards during operation. A pneumatically energized access port allows operator access to the working throat of the machine between inclined parallel rails above the jacking platform. Electro-pneumatic safety interlocks prevent machine operation when the access port is open.

45 Claims, 13 Drawing Sheets

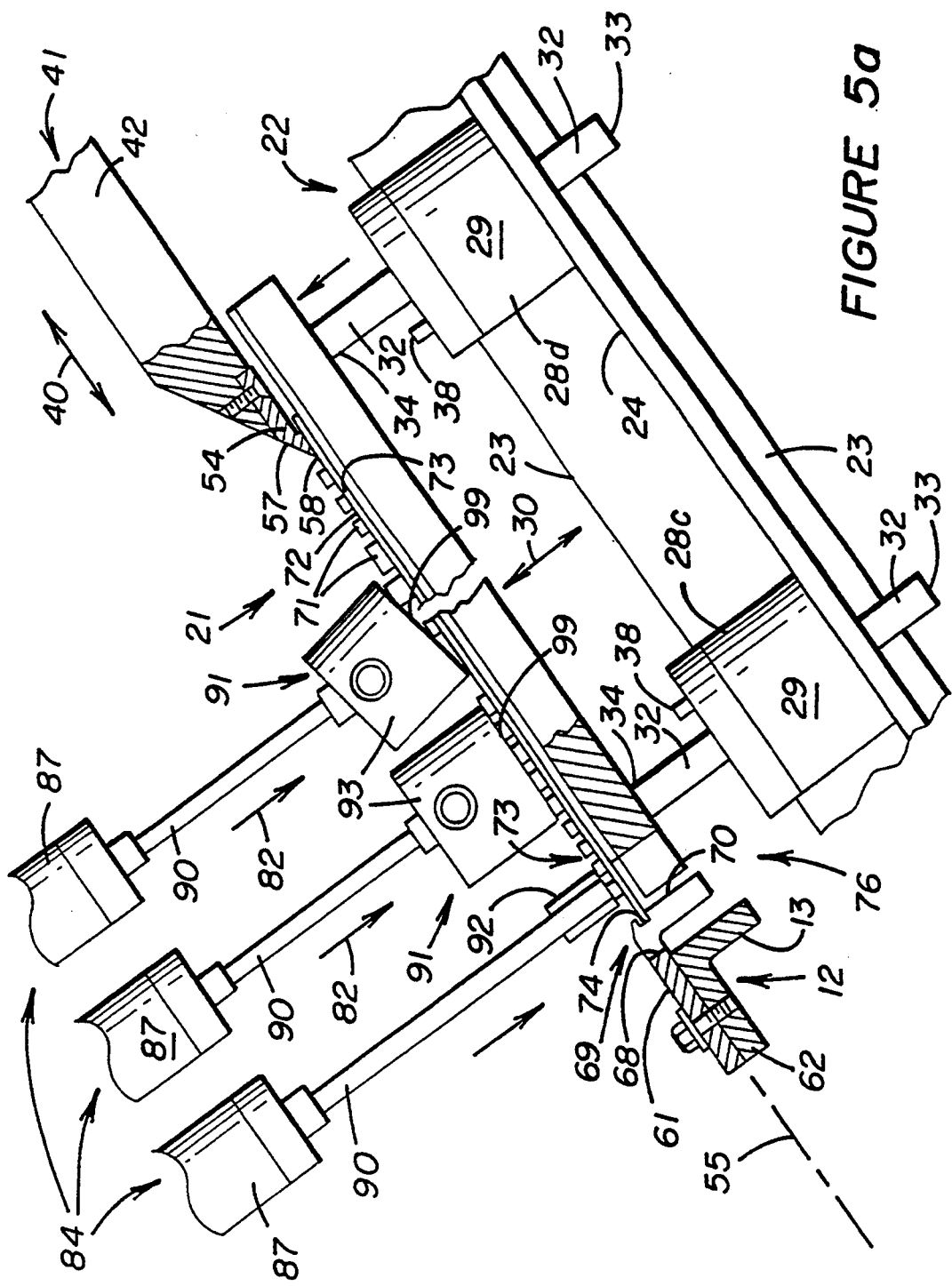

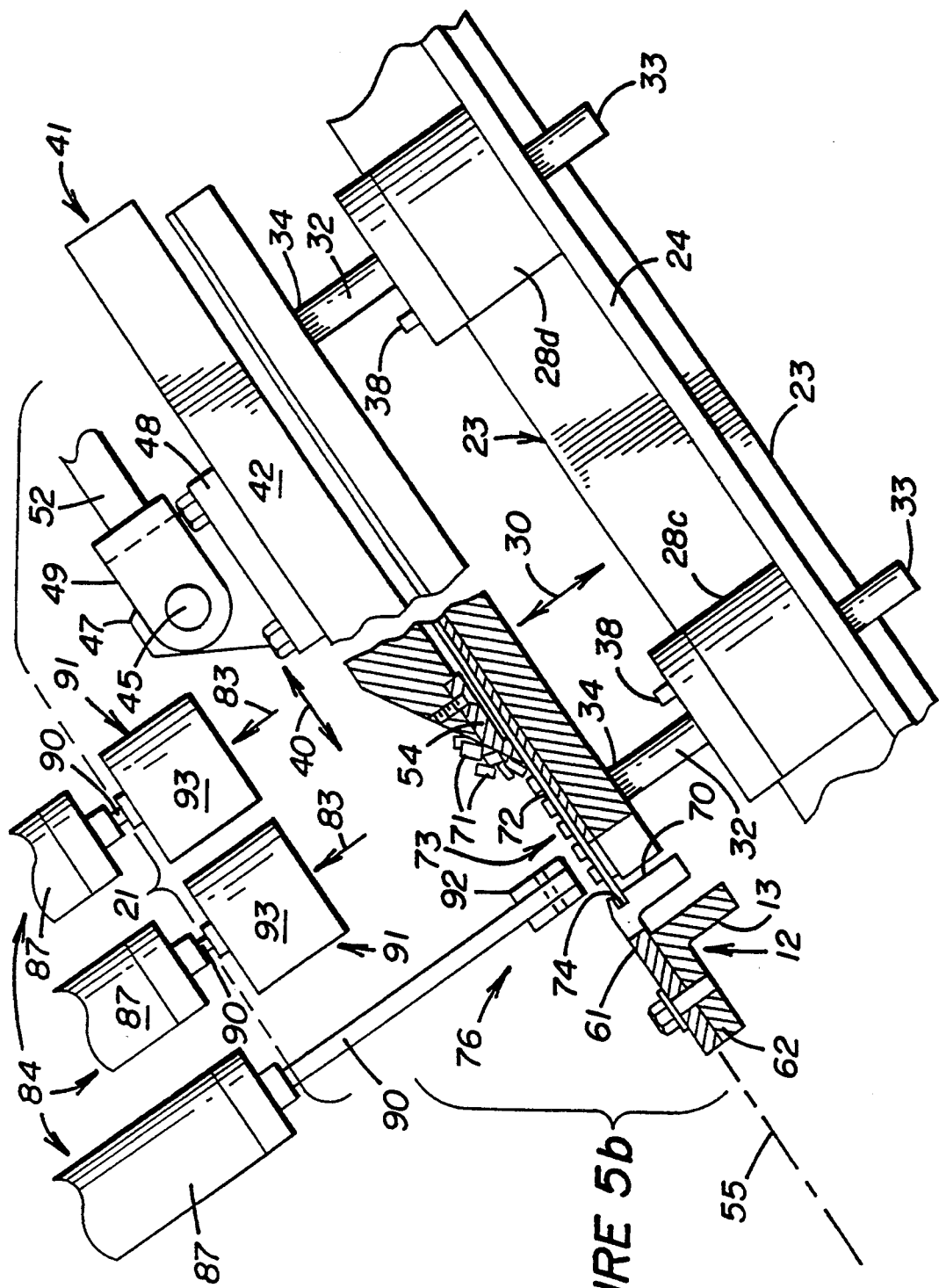

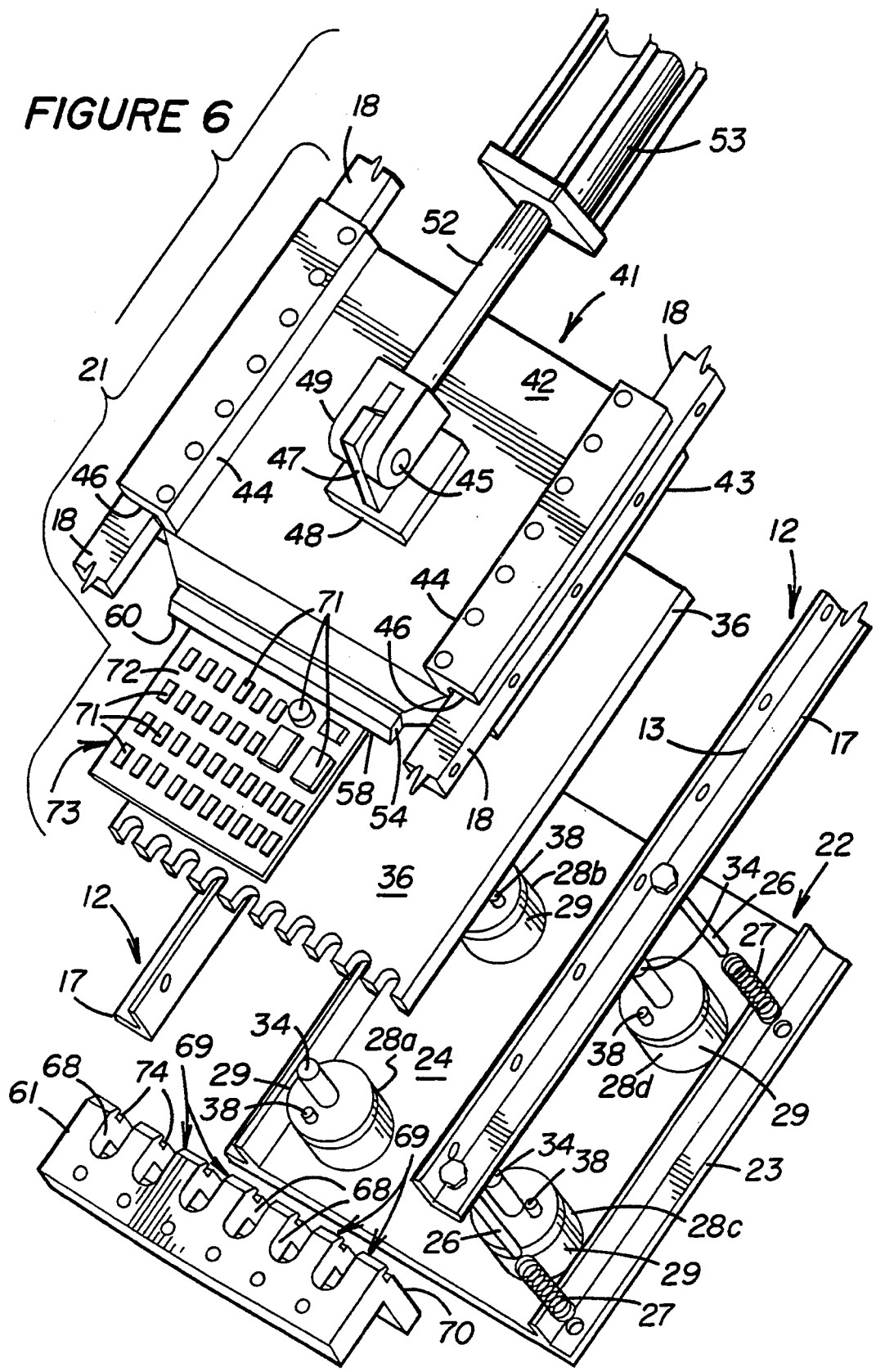

CIRCUIT BOARD COMPONENT SHEARING MACHINE

BACKGROUND OF THE INVENTION

1. Field of The Invention

The invention relates to machines for destructively shearing connectors, wires, and electronic components from the surfaces of circuit boards.

2. Description of the Prior Art

It is desirable and economically rewarding to recover or salvage valuable and scarce materials such as gold, silver, platinum, palladium, gallium, germanium, antimony, and iridium found in leads, connectors and other components attached to used, discarded, and defective electrical circuit boards, particularly those found in electronic devices such as computers. Typically, such circuit boards with attached components are placed in ball mills and ground into a powdered ore. Samples of the powdered (circuit board) ore in each batch are then assayed to determine content and a value per unit quantity is ascertained. With present trends of obsolescence in the computer industry, components, leads, and connectors attached to circuit boards comprise a very large and relatively accessible source of valuable raw materials. For example, backplane connector assemblies from obsolete IBM mainframe and mid-sized computers comprise a relatively copious source of gold.

The largest relative material components in circuit boards are fiber glass (epoxy and silicon) followed by copper, i.e., the basic substrate materials of printed circuit boards. Obviously, separating the basic circuit board substrate from the attached leads, connectors and other components before and milling the leads, connectors and components separately will produce powdered ores having much richer assays of valuable materials and greater values per unit quantity. However, separating or cutting such leads, connectors and other components from circuit board substrates is a time consuming, arduous and, consequently, costly endeavor.

SUMMARY OF THE INVENTION

In the invented machine, leads and connectors and other components on a printed circuit (PC) board are sheared from a surface of the PC board by a manually controlled, hydraulically driven shear. The invented machine includes a rigid frame structure supporting: (i) a carriage slideable on inclined parallel rails carrying a shear blade; (ii) a jacking platform providing a flat surface parallel the rails moveable perpendicularly for positioning a flat substrate surface of a PC board parallel to the shear blade; (iii) an anvil for capturing an edge of and supporting the PC board laid flatly, component side up, on the jacking platform against the thrust of the shear blade chiseling components off its surface; (iv) a plurality of normally retracted, pneumatically energized, clamping pistons which extend perpendicularly toward the jacking platform for clamping the PC board against the jacking platform; (v) a long thrust, double action hydraulic cylinder reciprocating the carriage sliding on the inclined parallel rails; and (vi) at least three, short thrust, single piston double-rod, (jacking) hydraulic cylinders reciprocating the jacking platform maintaining its platform surface parallel to the shear blade.

The shear blade carried by the carriage sliding on the inclined parallel rails, driven by the long thrust, double action hydraulic cylinder, establishes the shear or reference plane of the invented machine. The jacking platform moved by the jacking hydraulic cylinders perpendicularly relative to the inclined parallel rails positions the upper flat surface of the PC board substrate in the shear plane. The anvil located at the base of the shear plane, presents a planer engagement face perpendicular to the shear plane with a horizontal notch aligned in the shear plane for capturing and anchoring the edge of a PC board laid on the jacking platform against the thrust of the shear blade chiseling components from its surface.

The normally retracted, pneumatically energized pistons clamping the PC board against the jacking platform prevent the PC board from bending and buckling responsive to the thrust of the shear blade. A plurality of proximity switches are positioned adjacent the rails carrying the shear carriage for triggering sequential release of the pneumatic clamping pistons as the cutting edge of the shear blade carried by the carriage traverses down the inclined shear plane. A plurality of vertical notches are cut into the engagement face of the anvil and into the adjacent side of the jacking platform to provide a plurality of holes for allowing debris sheared from the surface of the PC board (leads, connectors and other components) falling and sliding down the inclined shear plane toward the anvil to drop into a collection bin located below the anvil and jacking platform. Protective walls shield operators and loaders from flying debris as components are chiseled from the surface of the PC board by the shear blade during machine operation. A pneumatically energized access port allows operator entry into the working throat of the machine above the jacking platform between the inclined rails. Electro-pneumatic safety interlocks prevent machine operation when the access port is open.

A primary hydraulic circulation loop includes a first manually actuated, four port valve for reciprocating the long thrust hydraulic cylinder driving the shear carriage. A secondary hydraulic circulation loop includes a second manually actuated, four port valve for reciprocating the short thrust, 'jacking' hydraulic cylinders adjusting the elevation of the jacking platform relative to the shear plane of the machine.

A significant advantage of the invented machine derive from a novel hydraulic mechanism utilizing at least three, single piston double rod, short thrust, hydraulic cylinders for adjusting the elevation of the jacking platform relative to the shear plane while maintaining its platform surface parallel to the shear plane of the machine, a feature which allows an operator to conveniently change the elevation of the platform to accommodate different PC boards being processed at the same time.

A unique feature of the invented machine is that the planer bottom surface of shear blade is either raked at a slight angle with respect to the shear plane or relieved a short distance behind its chisel edge to prevent material from building up on the under surface of the blade as it skims the surfaces of the PC boards shearing components off of them.

Another unique feature of the invented machine is that slideway surfaces of the shear carriage receiving the inclined parallel rails are bonded with a fluorocarbon resin and elastomer bearing material such as SLY-DAY ® which exhibits lubricating properties under conditions of high compression.

Another novel feature the invented machine are pivoting rod-ball couplings between the extending shafts and piston heads of pneumatically energized, clamping pistons which permit the piston heads holding the PC board against the jacking platform to tilt in two dimensions in order to accommodate components at different elevations on the surface of a PC board.

Still other novel features of the invented machine relate to a foot pedal actuated, pneumatic control and electrical safety interlock system for opening and closing the operator access port and enabling extension of the normally retracted clamping pistons.

Still other features, aspects, advantages and objects presented and accomplished by the invented machine for shearing leads and connectors and other components off printed circuit (PC) board substrates will become apparent and/or be more fully understood with reference to the following description and detailed drawings of preferred and exemplary embodiments.

DESCRIPTION OF THE DRAWINGS

FIGS. 5a & 5b are a side elevation cross sections illustrating the relationship of the shear blade, jacking platform, jacking hydraulic cylinders, anvil, and pneumatic clamping pistons as the shear blade is hydraulically driven down the shear plane chiseling leads, connectors and other components off the surface of a PC board.

FIG. 6 is an exploded perspective rendering presented for the purpose of illustrating the structural relationship of components of the invented machine which position, support and shear components off a PC board.

DETAILED DESCRIPTION OF PREFERRED AND EXEMPLARY EMBODIMENTS

Figure 1:
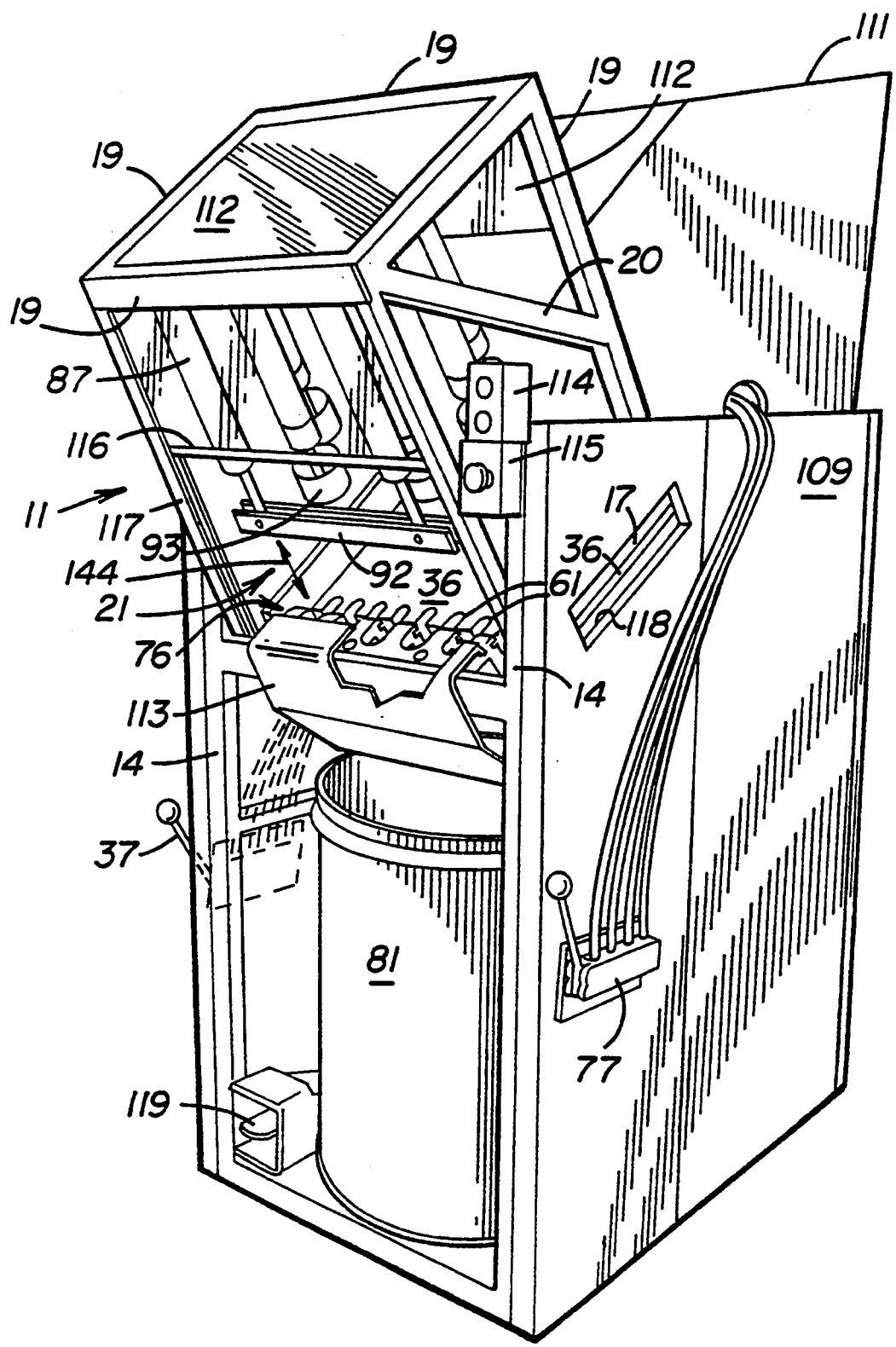
FIG. 1 shows a perspective of the invented machine within its protective housing and shields.

Looking at FIGS. 1 through 5b, the invented machine 11 includes an inclined rectangular shear frame 12 fabricated from right angle, structural steel bars 13 supported by a housing frame 14. A welded hexahedral box frame 16 formed of tubular steel members is welded to the side bars 17 of the shear frame 12 to provide additional stiffness. Solid square steel rails 18 are bolted to the inside surface of the side bars 17 of the shear frame 12. A welded tubular steel frame 19 with an angled tubular side struts 20 extends up from the box frame 16 and cantilevers over the throat 21 of the invented machine 11. A jacking bed 22 fabricated from two right angle, steel bars 23 welded to side edges of a rectangular steel plate 24 (FIG. 4) is supported below the lower end of the shear frame by four large steel 'hanger' bolts 26. Helical compression spring 27 encircle the hanger bolts 26 for maintaining separation of the jacking bed 22 and shear frame 12. An anvil 61 is secured to and supported by the end bar 62 at the lower end of the shear frame 12. Side plates 63 are welded at the upper ends 64 of the side bars 17 of the shear frame 12 for supporting a steel cross bar 66 above the shear frame side bars 17. The cylinder yoke 67 of a long thrust, double action, hydraulic cylinder 53 is bolted to the steel cross bar 66 midway between the side frame bars 17.

Figure 4:
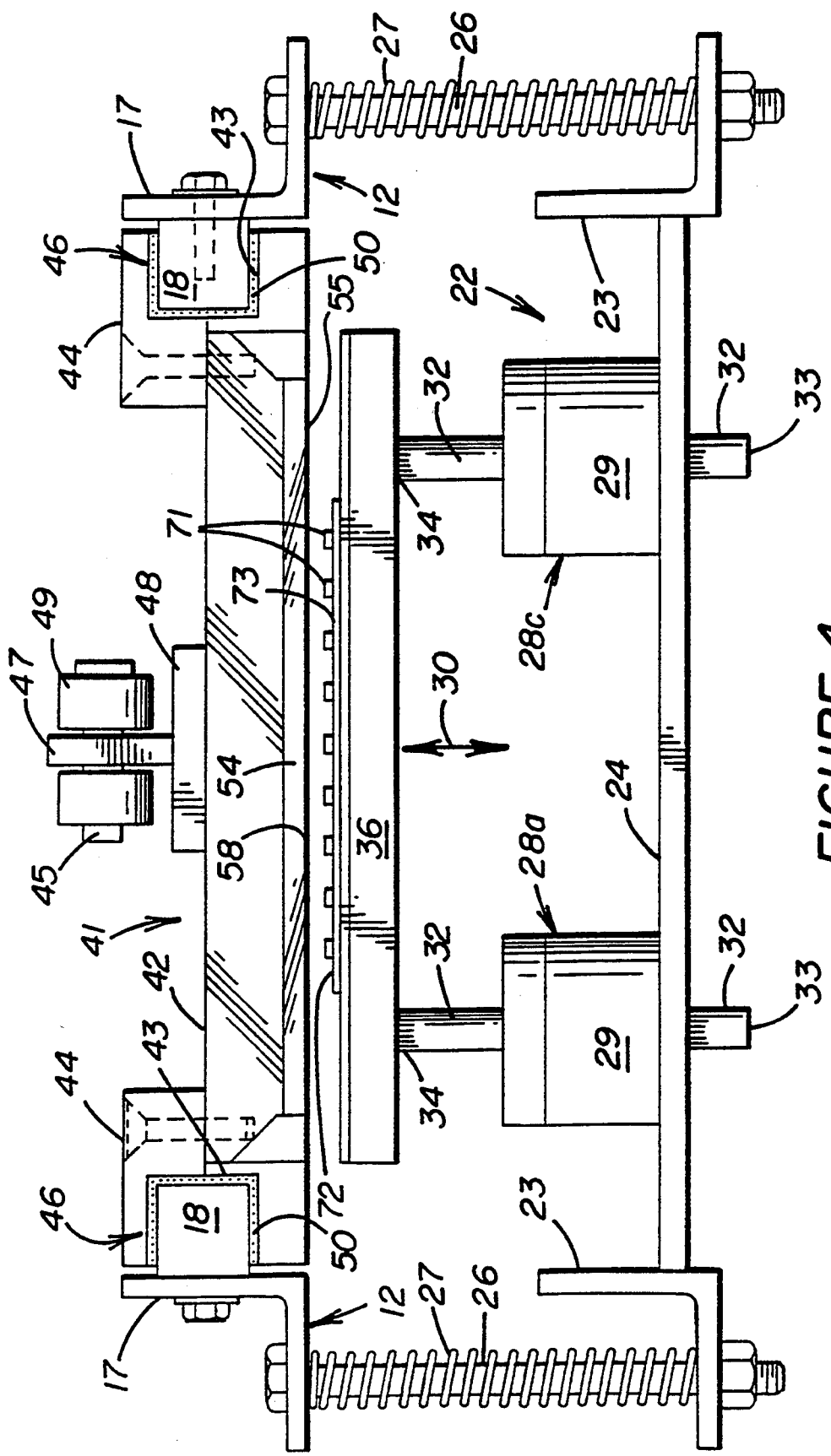
FIG. 4 is a front elevation cross section illustrating the relationship of the inclined rails, shear blade carriage slideways, jacking platform and jacking hydraulic cylinders supported within the shear frame of the invented machine.

Now looking at FIGS. 4 through 6, the carriage 41 fabricated of steel includes a plate 42 with 'L-shaped' bar clamps 44 bolted to its top surface adjacent rectangular reliefs 43 machined into the plate's opposite side edges. The 'L-shaped' bar clamps and the rectangular reliefs 43 define two rectangular slideway channels 46 sized for receiving the rails 18 fastened onto the shear frame side bars 17. A perpendicular connector 47 with an anchoring planer base plate 48 welded to the center of the plate 42 extends up for coupling the carriage 41 to the rod yoke 49 at the end of the reciprocating rod 52 of the hydraulic cylinder 53. Looking at FIGS. 7a & 7b, the shear blade 54 is mounted in a relief 56 cut into the underside of the plate 42 at the front edge of the carriage plate 42. The front edge of the carriage plate 42 is beveled at same angle as the upper inclined surface 57 of the shear blade. Optimally, the midline of coupling 45 securing connector 47 and the rod yoke 49 of the hydraulic cylinder 53 and the chisel edge 58 of the shear blade 54 are spaced equal distances above and below the rails 18. A fluorocarbon resin and elastomer bearing material 50 which exhibits lubricating properties under conditions of high compression is bonded to the interior surfaces of the slideway channels 46. For example, the linear bearing product marketed by Shamban Bering Division located at 711 Mitchell Rd. Newbury Park, Calif. 91320-2285 under the trademark SLYWAY ® is an excellent bearing material 50 for lining the interior surfaces of the slideway channels 46. As indicated by arrow 40 in FIGS. 5a & 5b, the long thrust, double action hydraulic cylinder 53 reciprocates the mounted carriage 41 up and down the rails 18. As the carriage 41 traverses down the rails, the chisel edge 58 of the shear blade 54 sweeps through a plane establishing the shear plane 55 of the invented machine.

The slideway channels 46 and rails 18 should be dimensioned such that bearing material 50 is compressed sufficiently for lubrication when the carriage is mounted for sliding on the rails within the shear frame 12. Further, the length of the carriage 41 (measured parallel the rails 18), the dimensions of the rails 18 and the dimensions of the 'L-bar' clamps 44 are selected to provide sufficient load carrying capacity to accept anticipated torque loading tending to twist the carriage 41 lengthwise about an axis perpendicular to the rails. Such torque loading of the carriage 41 derives from the range of resistance forces that are encountered by the shear blade 54 as it moves down the shear plane 55 chiseling components 71 off component-studded surfaces 72 of printed. circuit (PC) boards 73 positioned in the shear plane 55 within the throat of the invented machine.

In particular, focusing on FIGS. 5a, 5b & 6, a PC board 73 is placed, manually or otherwise, in the throat 21 of the invented machine, component side up, on the surface of a jacking platform 36 presenting a surface parallel to the shear plane 55. The anvil 61 captures and supports the bottom edge of a PC board 73 in a horizontal notch 74 at the base 76 of the shear plane 55. The anvil is basically a plurality of right angle fingers 69 fabricated from a right angle steel bar stock bolted to the bottom end bar 62 of the shear frame 12 presenting a vertical face 70 perpendicular to the shear plane 55 with a series of vertical reliefs (notches) 68 cut through the perpendicular face 70. The vertical notches 68 between the fingers 69 provide holes for channeling for components 71 chiseled from the surface 72 of the PC board 73 tumbling down the surface 72 of the board 73 into a collection bin 81 located below the anvil 61 and throat 21 of the invented machine.

Figure 10:
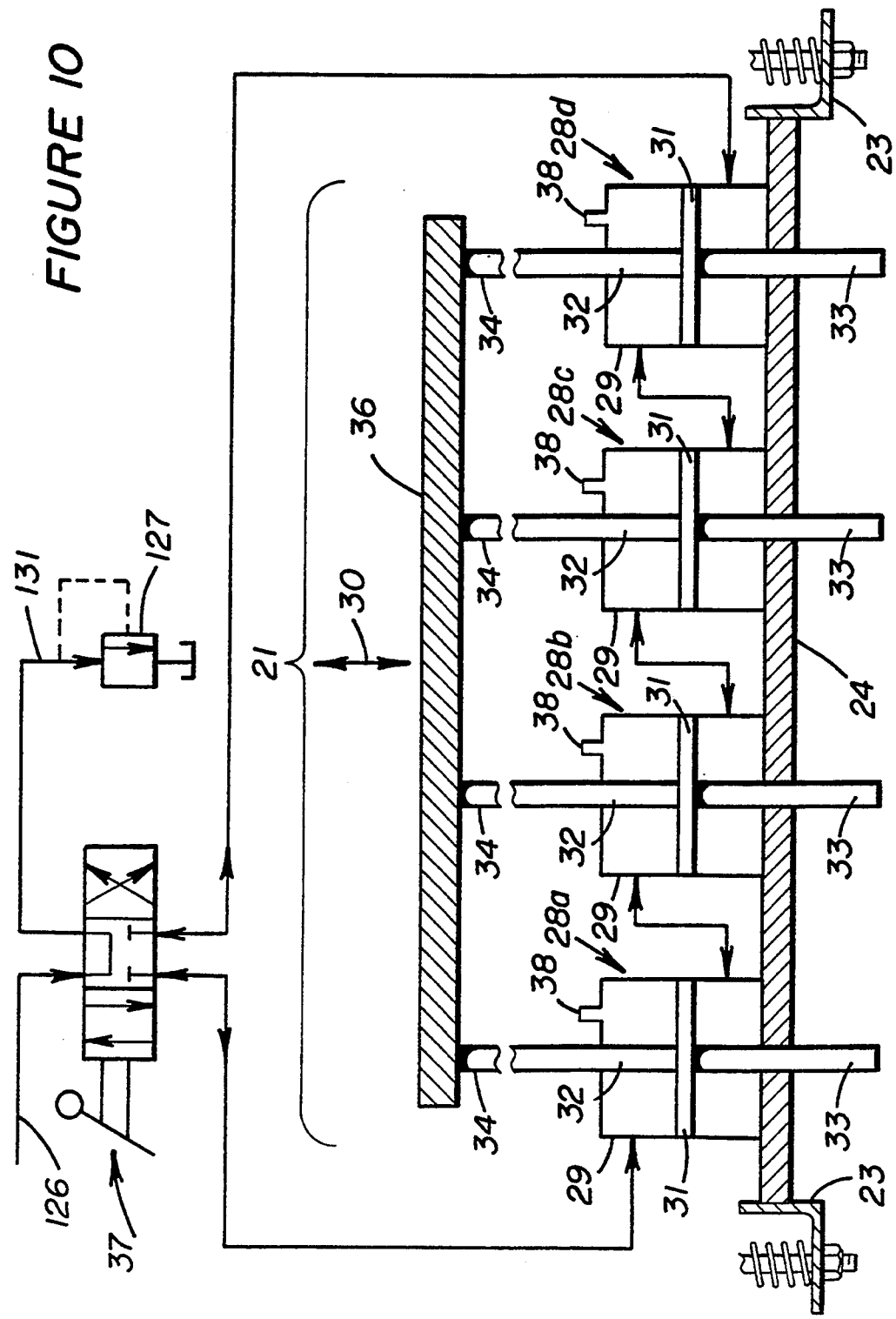
FIG. 10 is a hydraulic diagram of the secondary circulation loop showing the necessary interconnection of the hydraulic jacking cylinders for maintaining the jacking platform surface parallel to the shear plane as they extend and retract.

Looking at FIGS. 4 & 10, the four identical, short thrust, single piston double rod, 'jacking' hydraulic cylinders 28a–d are anchored perpendicularly on the upper surface of the steel plate 24 of the jacking bed 22. Each 'jacking' hydraulic cylinder 28 comprises an outer cylindrical housing 29 enclosing a piston 31 having a central rod 32 that extends from both ends of the cylindrical housing 29. The cylindrical housing 29 of each jacking cylinder is bolted to the jacking bed 22 and the piston 31 carrying the central rod 32, reciprocates responsive to hydraulic input within the length of the cylindrical housing 29. Holes (not shown) must be drilled through the steel plate 24 to accommodate the extending ends 33 of the rods 32 protruding from the bottoms of the cylindrical housings 29. The ends 34 of the rods 32 extending from the tops of the jacking cylinders 29 are fastened to the underside of and support the steel plate 'jacking' platform 36 in the throat 21 of the invented machine 11.

As schematically indicated in FIG. 10, the 'jacking' hydraulic cylinders 28a–d are hydraulically connected in series with the bottom chamber of cylinder 28a hydraulically coupled to the top chamber of cylinder 28b, the bottom chamber of cylinder 28b hydraulically coupled to the top chamber of cylinder 28c and the bottom chamber of cylinder 28c hydraulically coupled to the top chamber of cylinder 28d. The top chamber of cylinder 28a is hydraulically coupled to one input/output port of a conventional, four port, three position manual hydraulic valve 37 and the bottom chamber of cylinder 28d is hydraulically coupled to the other input/output port of the manual valve 37. The volume occupied by the rods 32 per unit length on either side of the pistons 31 is identical for both the top and bottom chambers of the respective jacking cylinders 28a–d. Accordingly, hydraulic liquid input into the upper chamber of cylinder 28a, translating the piston 31 and associated rod 32 downward will displace an identical amount of fluid from its lower chamber, inputting it into the upper chamber of cylinder 28b translating that piston 31 and associated rod 32 downward an equal distance. The serial displacement continues through the respective cylinders 28c & 28d with identical downward translation of pistons 31 and associated rods 32. The hydraulic liquid displaced from the bottom chamber of cylinder 28d exhausts via the output port of the valve 36. Similarly, hydraulic liquid input into the bottom chamber of cylinder 28d will translate each of the pistons 31 and associated rods 32 upward an equal distance. The jacking platform 36 secured to the top ends 34 of the rods 32 is thus translated toward and away indicated by the double headed arrow 30 in FIGS. 5a & 5b from the throat 21 of the invented machine by the separate, but serially connected 'jacking' hydraulic cylinders without tilting or altering the orientation of the planer surface of the jacking platform 36.

The 'jacking' cylinders each include a bleeding vent 38 to allow for individual adjustment of the translation position of the floating piston 31 and rod 32. Such vents 38 are necessary, initially during fabrication, to adjust the top rod ends 34 of the rods 32 to exactly same elevation after the 'jacking' cylinders 28a–d are anchored perpendicularly on the jacking bed 22. After, fabrication the bleeding vents are necessary to eliminate gas and air bubbles that may become entrapped in the chambers and associated hydraulic connecting lines between the jacking cylinders 28a–d. Great care should always be exercised during bleeding, and at all other times, to prevent air bubbles in the hydraulic circulation loops, particularly the loop reciprocating the jacking cylinders 28a–d because of their compressibility. To explain, a 'compressible' air bubble entrapped either in an upper, lower chambers or lines connecting the jacking cylinders 28a–d will disturb the 1:1 translation ratio of the respective pistons 31 of the serially connected cylinders 28a–d causing the jacking platform to tilt from its original orientation.

While three identical 'jacking' hydraulic cylinders would be sufficient to maintain the orientation of the jacking platform 36 (the top ends 34 of three rods 32 establish a plane), use of four or more identical 'jacking' hydraulic cylinder is recommended to prevent bending deformation of the jacking platform 36 and/or related off-axis deflection of the supporting rods 32 responsive to unbalanced loads imposed by an array 84 of normally retracted pneumatic clamping cylinders 87.

Figure 2:
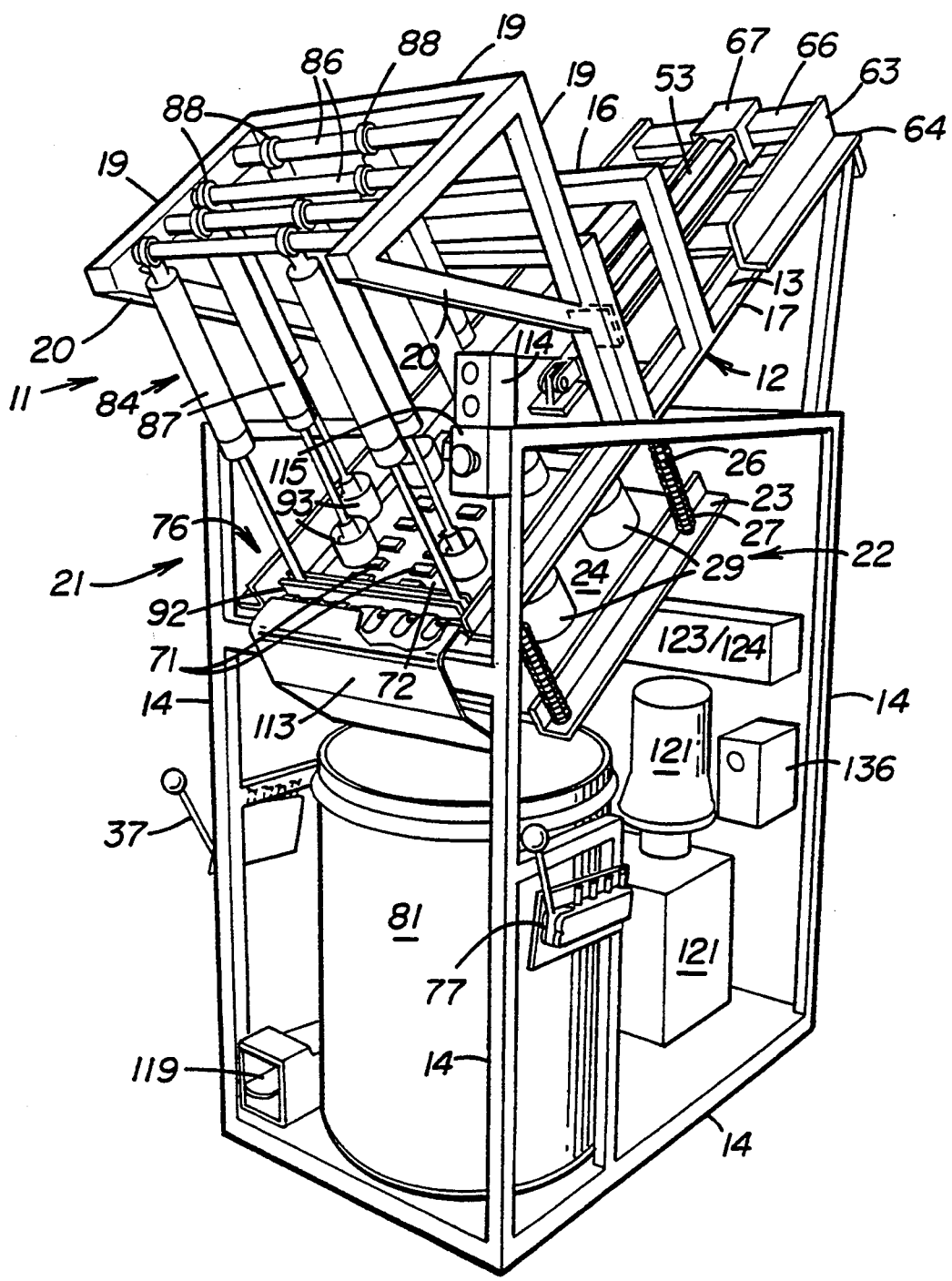
FIG. 2 is a perspective of the invented machine without the protective housing and shields.
Figure 3:
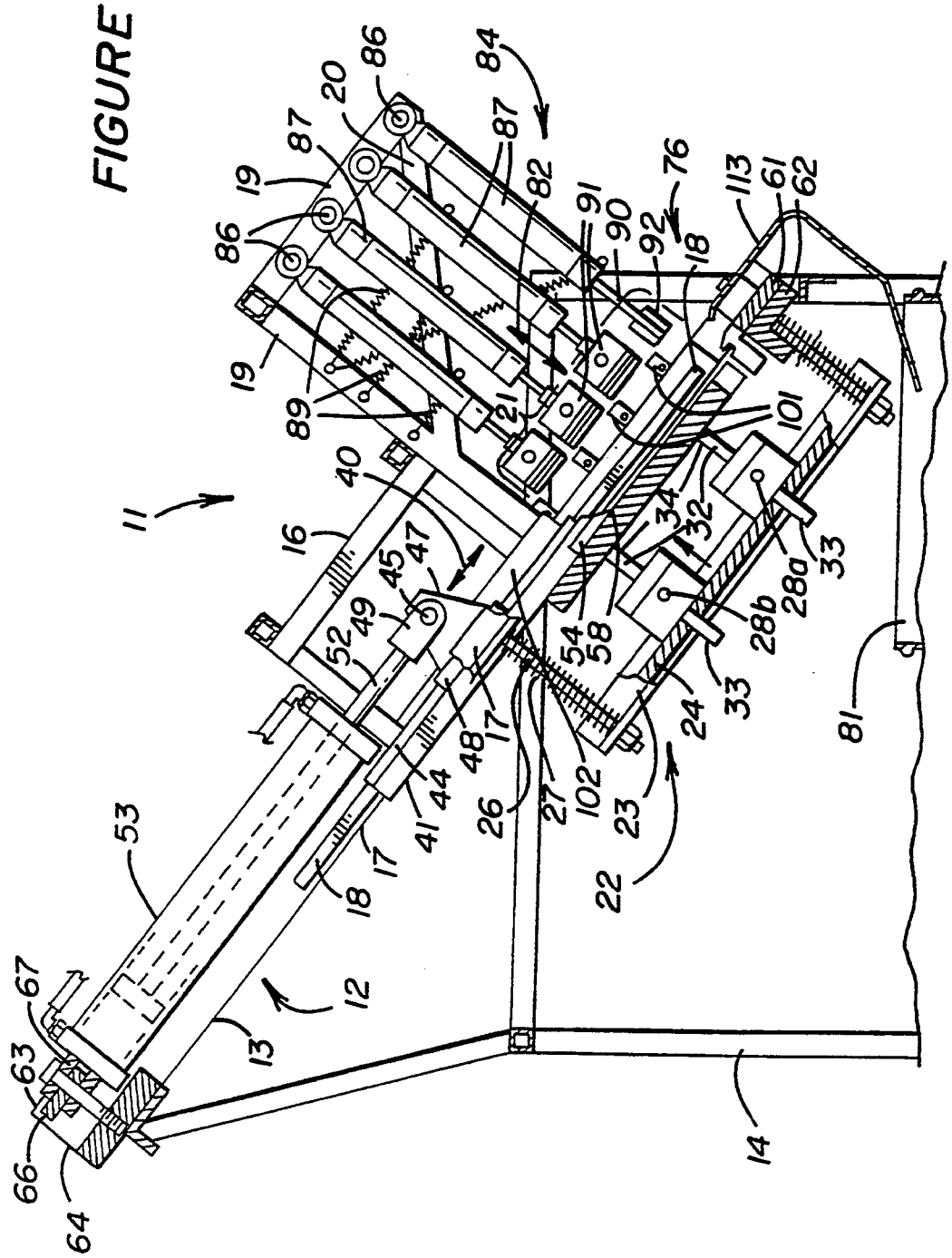
FIG. 3 is a side elevation view illustrating the relative relationship of the principal components of the invented machine.

In particular, looking at FIGS. 2, 3, 5a, 5b, & 8, the cantilever frame 19 supports a plurality of cross bars 86 transversally above the throat 21 of the invented machine 11. The array 84 of normally retracted pneumatic clamping cylinders 87 are anchored to the cross bars 86 by sliding mounts 88 allowing the transverse locations of the pneumatic cylinder 87 to be adjusted. As shown in FIG. 3, the pneumatic clamping cylinders 87 are held in position by resilient spring tethers 89 such that their extending rods 90 move perpendicularly relative to the machine shear plane 55 Piston heads 91 are pivotally coupled at the ends of the extending rods 90 of all the pneumatic cylinders 87 except those located proximate the base 76 of the shear plane 55 which are fastened to and support a transversely oriented clamping bar 92. Focusing on FIG. 8, the piston heads 91 are hollow pistons 93 of a type typically used in internal combustion engines. A rod-ball element 94 of a conventional pivoting coupling mechanism 95 mounted in the diametric pin ports 96 through the cylindrical walls 97 of the piston. The yoke element 98 of the pivoting coupling mechanism 95 receiving the ball of the rod ball element 94 is fastened to the end of the rod 90 from the pneumatic cylinder 87. Accordingly, the head faces 99 of the piston heads 91 are able to tilt or pivot about two perpendicular axes at the end of the rods 90. This enables the piston heads 91, when the pneumatic cylinders 87 are extended, to seat securely on different elevation components 71 studding a surface 72 of a PC board 73 supported on the jacking platform 36 within the throat 21 of the machine 11 (See FIG. 5a).

Now, looking at FIGS. 5a & 5b, as the shear blade 54 is driven down the shear plane 55 chiseling components 71 from the top surface 72 of the PC board 73, it encounters considerable resistance, transferring a substantial percentage of the driving force supplied by the long thrust driving hydraulic cylinder 53 reciprocating the carriage 41 to the substrate of the PC board 73 compressing it edgewise against the anvil 61. As the PC board 73 deforms responsive to such stress, a component of the transferred driving force will cause the PC board 73 to bend or bow and ultimately buckle upward away from the supporting surface of the jacking platform 36. Such displacement is deleterious as it moves the top surface 72 of the board 73 out of the shear plane 55 causing the blade 54 to cut into and through the surface 72 of the board 73. The normally retracted clamping cylinders 87 when extended with piston heads 91 engaging the surface of the board 73 provide a force generally perpendicular to the board surface 72 to counter balance the component of the transferred driving force tending to bow or bend the board 73 upward away from the supporting surface of the jacking platform 36.

The downward clamping thrust or force provided by the array 84 of pneumatic clamping cylinders 87, indicated by the arrows 82 in FIG. 5a, should be transferred as uniformly as possible to the surface 72 of the board 73. Because different PC boards 73 have differently sized and located components studding their respective planer surfaces it is sometimes necessary; to adjust the transverse locations the pneumatic clamping cylinders 87 in the clamping array such that a particular pivoting piston head 91 seats with maximum head face 99 contact with components 71 studding the board surface 72. In particular, such components transfer the clamping force to the board surface 73, and the efficacy of the force transferred is a function of the cross section area of such supporting components in a plane parallel to the shear plane 55 of the machine 11. The tiltable piston heads maximize such contact of the head face 99, and thus assure transfer of the clamping force provided by a particular pneumatic clamping cylinder to a maximum surface area of the board 73.

As indicated in FIG. 5b, the normally retracted pneumatic clamping cylinders 87 release and retract the piston heads 91 upward (arrows 83) out of the path of the shear blade 54 carried by the carriage 41 as it is driven down the shear plane 55 by the long thrust double action hydraulic cylinder 53. Looking at FIG. 3, a series of conventional mechanical proximity switches 101 are mounted on the shear frame side bar 17 positioned to be tripped as the carriage 41 is driven down the rail 18 by an adjustable tripping tongue 102 secured to the top surface of the carriage plate 42. Tripping of a particular proximity switch 101 interrupts or releases pneumatic pressure extending the rods 90 of the pneumatic cylinders 87 anchored on a particular cantilever frame cross bar 86 of the cantilever frame 19 allowing the rods 90 of those particular cylinders to retract. The position of the tripping tongue 102 is adjustable in a direction parallel to that of rails 18 and carriage movement (arrows 40). To explain, the tripping tongue 102 must be positioned to engage and trip a particular proximity switch 101 and release the normally retracted pneumatic clamping cylinders 87 anchored to a particular cross bar 86 as the chisel edge 58 just ahead of the shear blade 54 moving down the shear plane 55. The tripping tongue 102 should have sufficient length to maintain engagement with the first proximity switch 101 in the series keeping it tripped as the edge 58 of the shear blade 54 moves down the shear plane and remains below the initial tripping position. This means that each proximity switch 101 in the series remains tripped until the shear carriage 41 is retracted back up the shear plane 55 sufficiently to release engagement with the tripping tongue 102. Accordingly, a row of pneumatic clamping cylinders 87 in the clamping array 84 controlled by a particular proximity switch can not be energized to extend if the piston heads 91 in that particular row would strike the shear blade 54 or carriage 41.

As previously mentioned, the horizontal notch or relief 74 cut into the perpendicular faces of the anvil fingers 69 captures and supports the lower edge of the PC board 73. The anvil 61 is positioned such that the upper wall of the horizontal notch 74 coincides with or is immediately above the machine shear plane, and prevents the edge of the PC board 73 from slipping over the top of the anvil 61 responsive to the transferred diving force or thrust from the shear blade 54. The lower wall of the horizontal notch 74 is located below the machine shear plane 55, and prevents the PC board 73 from being extruded out of the machine throat 21 responsive to the transferred thrust from the shear blade 54 via the space between the anvil 61 and the jacking platform 36. The width dimension of the notch 74 is determined by the range in thicknesses of PC boards expected to be encountered. The clamping bar 92 driven by two or more of the energized (extended) pneumatic clamping cylinders 87, also cooperates with the surface of the jacking platform 36 supporting the board 73 to hold engagement and alignment of the bottom edge of the board in the horizontal notch 74 as the board deforms responsive to stresses incident the shearing action of the shear blade being driven down the shear plane chiseling components 71 from the board surface 72.

Turning again to FIGS. 7a & 7b, the bottom surface 60 of shear blade 54 is either raked at a very shallow angle above the shear plane ranging from 1° to 5° (FIG. 7a), or is relieved a short distance behind its chisel edge 58. The screws 75 securing the blade 54 to the underside of the carriage plate 42 are located in the volume between the bottom 60 of the blade 54 and the shear plane 55 to minimize wear of the screw heads 65. In particular, some components 71 sheared from the surfaces 72 of PC boards 73 are composed of very hard and brittle ceramic materials which shatter when the they are chiseled from the surface of the board 73. Such shattered ceramic material is an efficient abrasive material particularly when compressed between the underlying surfaces of the shear blade 54 and the sheared top surface 72 of the PC board substrate. (See FIG. 5b). Such abrasive materials coupling between the bottom 60 of the blade 54 cause excessive wear and greatly increase thrust transferred to the PC substrate because of increased friction. A volume between the bottom 60 of the blade 54 behind the chiseling edge 58 and the shear plane 55, however achieved, is necessary to prevent such crushed and shattered materials from becoming trapped and compressed between blade and the PC substrate as the carriage 41 is driven down the rails 18.

Figure 7A:
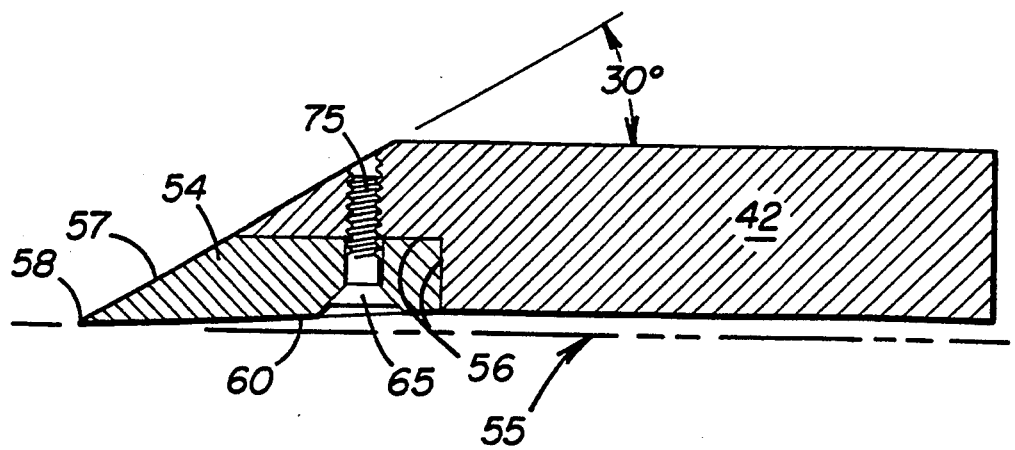
FIGS. 7a & 7b show side elevation cross sections of alternative embodiments of the shear blade.

Looking now at FIGS. 3, 5a, 5b, 7a & 7b, the chiseling edge 58 of the shear blade 54 carried by the carriage 41 driven down the rails 18 by the long thrust hydraulic cylinder 53 establishes the shear plane 55 of the machine 11. The upper surface 57 of the chisel edge 58 is inclined. Accordingly, as the edge 58 engages and severs the connections between a component 71 and the PC board 73, the inclined top surface 57 of the edge 58 displaces the matrix or body of the component upwards establishing a shearing stress, inducing failure of connections between the component and the board in peel, ideally just ahead of the chisel edge 58 of the blade. If the inclination of the top surface 57 of the blade 54 is too abrupt, the blade 54 would function more as a scraper than a chisel greatly increasing the force or thrust transferred to the PC board substrate. Similarly, when the inclination of the top surface 57 is too slight, excessive thrust is transferred to the PC board substrate by the chisel edge 58. Also, a thinner blade can flex excessively causing the blade 54 to dive into and cut through the PC board substrate allowing the entire board to slip up the inclined surface 57 over the shear blade 54 and onto the carriage plate 42 as the carriage 41 is driven down the machine shear plane 55. A top blade surface inclination of 30°−5+0 with a bottom surface rake of 1° above the shear plane 55 has been found suitable for most PC boards. (FIG. 7a.)

Figure 7B:
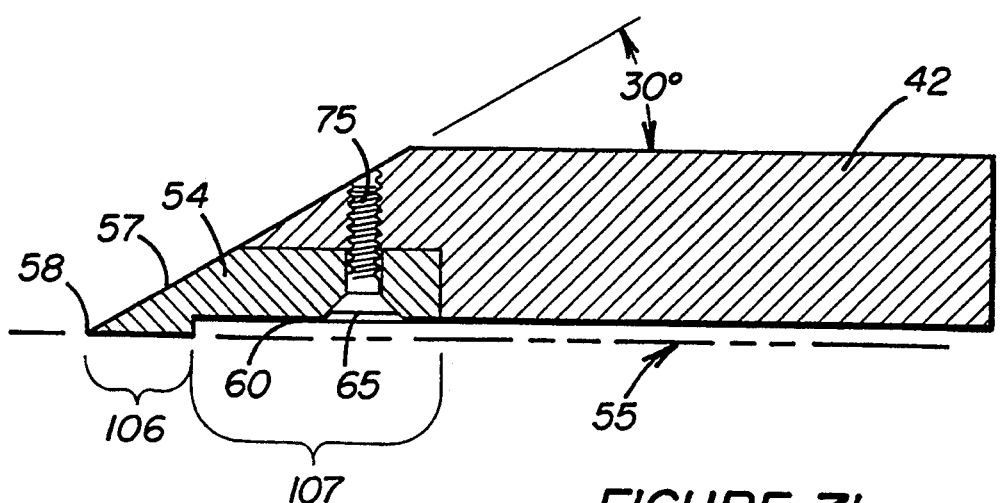
Figure 8:
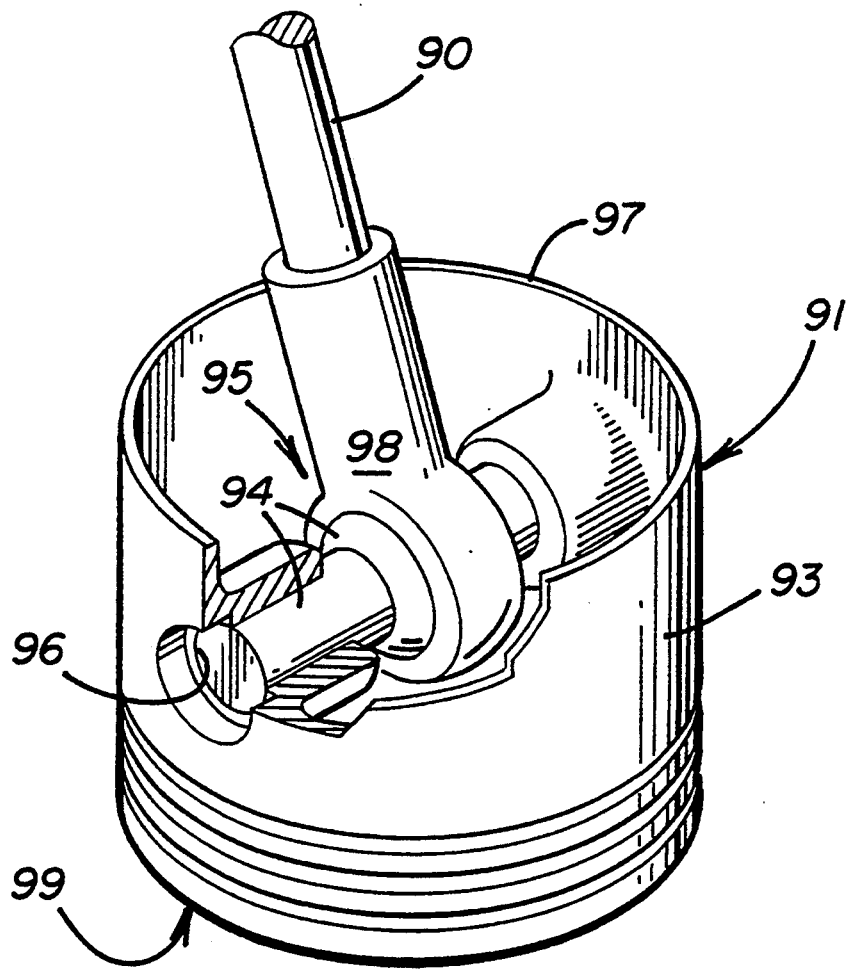
FIG. 8 is a perspective rendering of the pivoting ball coupling securing the piston head to the shaft of the pneumatic clamping pistons.

Alternatively, looking at FIG. 7b, the bottom or foot surface 106 of the blade 54 is planer and relatively narrow compared to the shank section 107 of the blade 54. The width of the narrow planer bottom or foot surface 106 of the chisel edge 58 may also be varied. While primarily determined by wear, the width of planer foot surface should be sufficient to minimize downward deflection of the PC board substrate matrix pivoting or bending on the chisel edge 58. The upper limit on width for the planer foot surface 106 is established by the point at which frictional coupling between the board surface 72 and the planer foot surface 106 increases the thrust transferred to the PC board intolerably. In particular, thrust transferred to the PC board substrate becomes intolerable when it causes the PC board 73 to bulge upward against the force of the clamping array 84 holding it against the surface of the jacking platform 36 in front of the blade edge 58. In the event of a bulge, the blade 54 will cut into and through the board allowing it to slip up over the blade onto the carriage plate 42. Also, depending on the dynamics of a particular board, crud build up on the bottom surface 60 of the blade 54, if excessive, can deflect the top surface of the PC board substrate 73 downward below the shear plane 55 ahead of the blade causing the blade 54 to engage the body or matrix of attached components 71 rather than at the juncture interface of the components and board. Finally, the width of the planer foot surface 106 determines the useful life of a shear blade 54. In particular, it is desirable to be able to re-sharpen and reuse the blades 54 after they are dulled by wear. In general, blades with planer foot surface having widths ranging around 0.50 inches have been found to perform satisfactorily.

Referring now to FIGS. 1–3 the inclined shear frame 12 of invented machine 11 is supported by a hexahedral housing frame 14 such that the base 76 of the machine is at approximately work bench height above floor surface. As shown in FIG. 1, a protective housing 109 secured to and supported by the frame structure 14 completely encloses the machine 11 on three sides. A cover 111 is placed over the double action hydraulic cylinder at the upper end of the shear frame 12. Impact resistant, transparent plastic walls 112 fastened to the cantilever frame 19 and shear frame side bars 17 enclose the array 84 of pneumatic clamping cylinders 87 mounted above the machine throat 21. The collection bin 81 or barrel slides into and out off the housing 109 below the anvil 61 and jacking platform 36 at the base 76 of the machine. A component deflection panel 113 is supported outward from the lower end bar 62 of the shear frame 12 at the front of the machine 11 for channeling debris chiseled from the surfaces of PC boards collecting in the throat 21 of the machine into the collection bin 81.

Operator access to the working throat 21 of the machine 11 is primarily via a pneumatically actuated access door 116 composed of the same impact resistant transparent material as the walls 112. The access door 116 translates up and down a rail frame 117 secured and supported at the top by the cantilever frame 19 and at the base by the shear frame side bars 17. Double headed arrow 144 in FIGS. 1 and 11 indicates translation of the access door 116 within the rail frame 117. Access to the throat 21 of the machine is also possible via side slots 118 cut through the side walls of the protective housing 109. Such side slots 118 should be located to allow throat access below the shear frame side bars 17 and above the jacking platform surface 36. Two conventional, four port, three position manual hydraulic valves 37 and 77 are mounted at approximately waist height on the side panels on either side of the protective housing 109 at the front of the machine. A pneumatic foot peddle actuator 119 is secured at the front of the machine to the base of the housing frame 14 for controlling raising and lowering of the access door 116 and energizing the array 84 of normally retracted pneumatic clamping cylinders 87.

Figure 11:
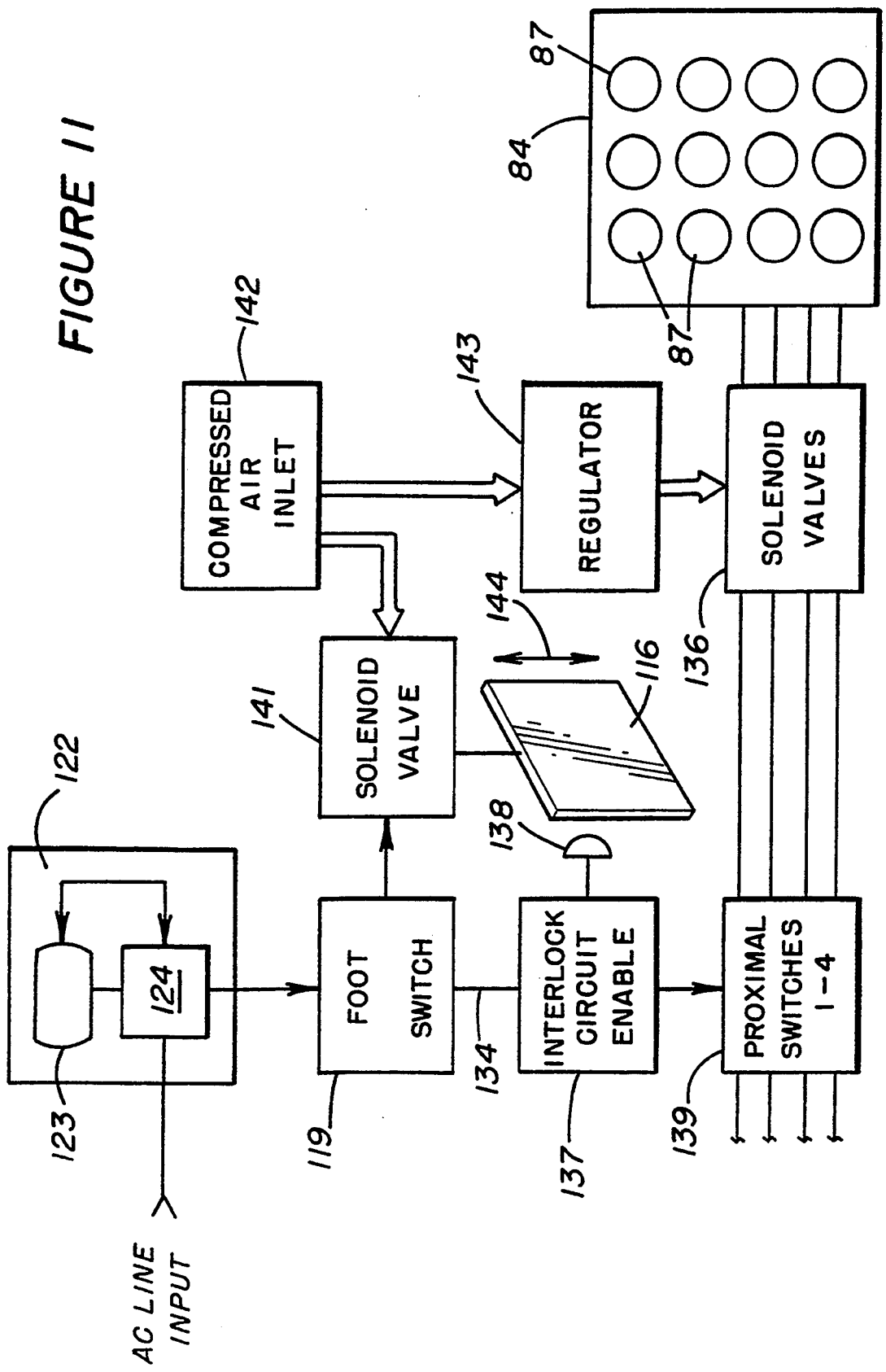
FIG. 11 is a pneumatic diagram showing the pneumatic elements of the invented machine and the associated safety interlocks for the invented machine.
Figure 12:
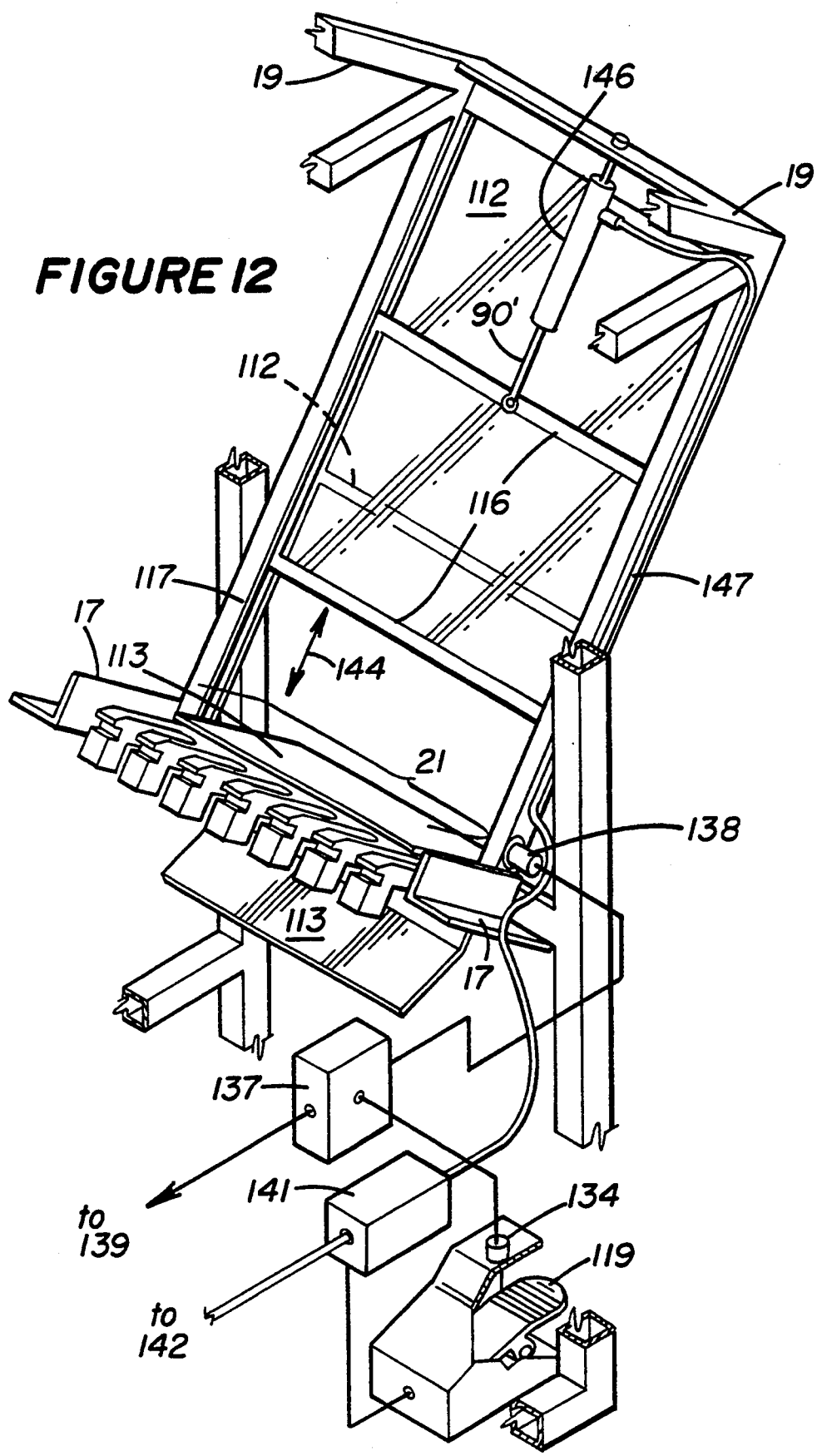
FIG. 12 is a back view of an exemplary access door allowing and preventing access into the throat of the invented machine schematically illustrating operation of the foot peddle and safety interlock system.

FIG. 12 illustrates a back view of the pneumatically actuated access door 116. A conventional pneumatic cylinder 146 is secured at the top of the steel frame 19 with its extending rod 90' fastened at the top of the access door 116 for translating the door up and down for allowing and preventing access to the machine throat 21. A foot peddle actuator 119 toggles an electrical switch, 137 for energizing and de-energizing a solenoid pneumatic valve 141 controlling pneumatic (air) pressure for opening and closing the access door 116. Pneumatic pressure is supplied to the solenoid pneumatic valve 141 from a source of compressed air 142 (See FIG. 11). Conventional pneumatic lines 147 couple between the solenoid pneumatic valve 141 and the pneumatic cylinder 146. Referring to FIG. 11, the foot peddle actuator 119 also closes a normally open proximity switch 134 to provide electrical power to a solenoid actuated, pneumatic valve array 136. An operator positioned in front of the machine can observe the interaction of the shear blade 54, the PC board 73 and the array 84 of pneumatic clamping cylinders 87 in the working throat 21 of the machine through the transparent access port 116. He controls reciprocation of the shear carriage 41 with one hand using the conventional, four port, three position manual hydraulic valve 77, and elevation of the jacking platform 36 with the other hand using the conventional, four port, three position manual hydraulic valve 37. In a typical operating cycle, the operator retracts the shear carriage 41 to the top of the shear plane, and lowers the jacking platform. The array 84 of normally retracted pneumatic clamping cylinders 87 de-energized in the prior cycle have already retracted. The operator then opens the access door 116 and manually places and orients a PC board, component side up, flatly on the surface of the jacking platform with an edge resting in the horizontal notch 74 cut into the face of the anvil fingers 69. Alternatively the PC board can be introduced into the machine throat via the side slots 118 in which case the operated merely orients the board on the jacking platform. Using the footer peddle actuator 119, the operator closes the access door and energizes the array 84 of pneumatic clamping cylinders extending the rods 90 driving the piston heads 91 down to engage the component studded top surface of the PC board clamping to the surface of the jacking platform 36. If the operator is not happy with the way the pneumatic array 84 clamps the board to the jacking platform he can release engagement of the pneumatic clamping cylinders 87, raise the access door 116 and re-orient the board or adjust the translation positions of the respective pneumatic cylinders 87 making up the clamping array 84. Once satisfied with the engagement of the clamping array 84 on the surface of the board, the operator advances the shear carriage 41 down the rails 18 until the chisel edge 58 of the shear blade is just above the surface of the PC board substrate at its top edge. The operator then elevates the jacking platform 36 with clamping array 84 fully engaged, until the top surface of the PC board just contacts the planer foot surface 106 of chisel edge 58 the blade 54. The operator then advances the shear carriage 41 down the shear plane 55, and the shear blade 54 shaves, chisels and shears all components from the upper surface of the board. As the shear carriage 41 advances, the tripping tongue 102 on the carriage 41 sequentially trips the proximity switches 101 sequentially releasing the clamping array 84 in rows as the shear blade 54 carried by the carriage 41 is driven down the shear plane 55. If necessary the operator can retract the shear carriage 41, re-engage the clamping array pneumatic cylinders 87 in rows below the blade edge 58, adjust the elevation of the jacking platform 36 and advance the shear carriage again to realign the top surface of the board in the shear plane. The operator should not advance the shear carriage down the shear plane beyond a point where the blade edge 58 can trap and drive components sheared form the board against the anvil 61. In fact, the maximum extension of the long thrust hydraulic cylinder 53 driving the shear carriage 41 should be adjusted prior to a particular run such that there always is space between the abutting surface presented by the anvil fingers 69 and chisel edge 58 of the blade 54 to preclude the blade from engaging and driving the matrix or body of components sheared from the board surface against the anvil 6. The operator then retracts the shear, releases the clamping array 84, opens the access door 116 and reorients the PC board on the jacking platform for shearing off the components remaining on its surface. Typically those components that are initially adjacent the anvil 61 are not sheared from the board on the first pass. He then re-engages the clamping array 84 and advances the shear carriage 41 to chisel off such remaining components. The carriage 41 is then retracted to the top of the shear plane The shorn PC board is removed from the jacking platform and placed in a separate receptacle.

A conventional on/off power control switch 114 is mounted on the frame 14 at the front of the machine 11 to allow the operator to turn the machine on and off by interrupting electrical power to the machine. Also, a conventional emergency power interrupt "slam button" switch 115 is mounted to the frame 14 exterior the protective paneling 109 at the front of the invented machine 11. Preferably, the "slam button switch 115 is located at a position where an operator can reach it with either hand to slam the switch 115 for interrupting machine operation in the event of a malfunction.

Components and connectors sheared from the PC board tumble down the surface of the board (FIG. 5b) and generally collect at the juncture of the clamping bar 92 and board just above the anvil 61. The spring tethers 89 holding the pneumatic clamping cylinders 87 in position allow a cylinder and its extending rod 90 to swing out, pivoting on the cantilever cross bar 86 toward the front of the machine releasing engagement with the component surface of the PC board to prevent potential problems due sheared components jamming between the advancing shear blade 54 and carriage 41 and piston heads of the still extended pneumatic cylinders 87 of the clamping array 84.

Also to preclude inadvertent engagement of the shear blade 54 with the jacking platform 36, the elevation of the jacking bed 22 relative to the shear plane to which the jacking cylinders 28 are secured is adjusted using the hanger bolts 26 such that upon maximum extension of the jacking cylinders 28, the surface of the jacking platform 36 is spaced below the shear plane a distance at least equal to the maximum thickness of PC board substrate expected to be processed through the machine. The hanger bolts also enables an operator the flexibility of tilting the jacking platform 36 with respect to the shear plane 55 of the machine, to accommodate boards that have components on both surfaces and/or which do not lay flatly on jacking platform with a component studded surface aligned in the shear plane.

Figure 9:
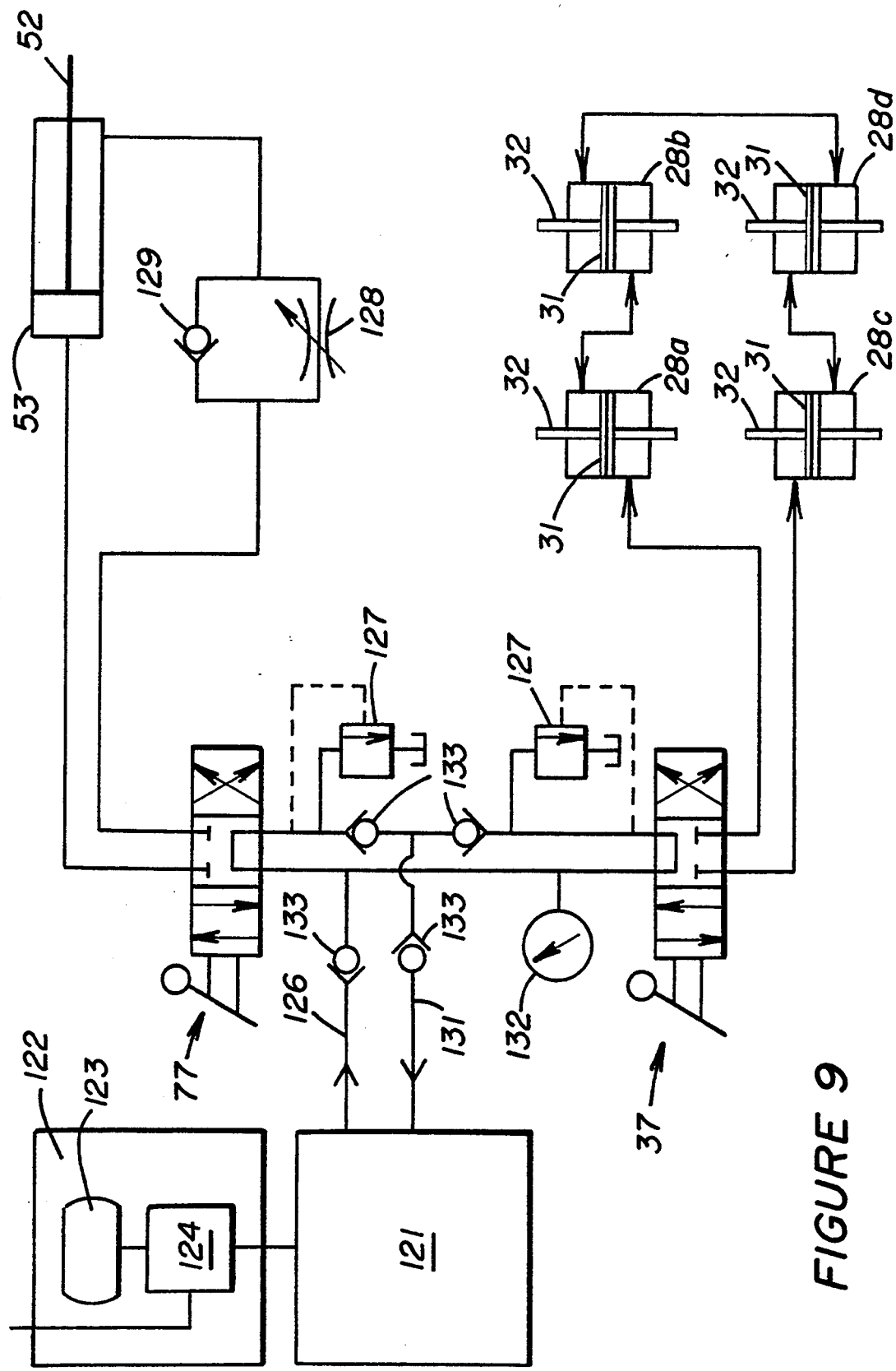
FIG. 9 is a hydraulic diagram of the primary and secondary circulation loops of the invented machine.

The diagram of FIG. 9 illustrates the hydraulic system for controlling reciprocation of the long thrust hydraulic 53 driving the shear carriage and the array of jacking cylinders 28a-d adjusting the elevation of the jacking platform 36. A conventional hydraulic power source indicated symbolically by the block 121 typically includes an electrical motor, a pump, a liquid reservoir, a primary pressure relief valve, a manifold, a liquid level indicator, a return filter , a filter gauge, a thermometer and a filler breather. Electrical power input to the hydraulic power source 121 is supplied via an electrical control module symbolically indicated by the block 122 which includes system control circuits symbolically indicated by the block 123 and a power controller symbolically indicated by the block 124. Hydraulic output 126 from the hydraulic power source 121 is directed using conventional, four port, three position manually operated valves 37 and 77 to elevate and lower the jacking cylinders 28a-d and to extend and retract the long thrust cylinder 53 respectively. The manual valves 37 & 77 each include conventional pressure relief mechanisms indicated schematically at 127. An adjustable flow control valve 128 and a check valve 129 are connected in parallel to restrict flow from the long thrust cylinder 53 during rod extension yet allow unrestricted flow during rod retraction. The rate at which the shear carriage moves down the shear plane is set by adjusting the flow control valve 128. However, reverse flow though a check valve 129 bypassing the flow control valve 128 allows for rapid retraction of the carriage up the shear plane. Hydraulic liquid returns to and is recirculated by the hydraulic power source via the hydraulic exhaust port 131. The system includes a pressure indicator 132 and check valves 133 for appropriately isolating the respective circulating loops.

The diagram of FIG. 11 illustrates the elements of a conventional pneumatic control system for energizing extending the normally retracted, pneumatic cylinders 87 making up the clamping array 84. In particular, electrical power is supplied via the electrical control module 122 which includes the system control circuits 123 and the power controller 124, as previously indicated. The foot peddle actuator 119 includes a normally open proximity switch 134 which interrupts electrical power to a solenoid actuated, pneumatic valve array 136. Also interrupting electrical power to the solenoid actuated, pneumatic valve array 136 is an enable circuit interlock 137 reading a sensor 138 determining the open/closed status of the access door 116, supplying power if and only if closed access door status is sensed. A plurality of gate circuits indicated at 139 selectively interrupt electrical power to particular valves in the solenoid actuated, pneumatic valve array 136 allowing them to exhaust responsive to tripping of one of the series of proximity switches 101 mounted on the shear frame side bar 17 by the tripping tongue 102 secured to the shear carriage 41. Finally, the foot peddle actuator 119 energizes a solenoid valve 141 for supplying pneumatic (air) pressure for closing the access door 116. Pneumatic pressure is supplied to the solenoid pneumatic valve array 136 from a source of compressed air 142 via a conventional air spring pressure regulator 143.

The system control circuits basically comprises conventional circuitry for implementing the function of the power on/off switch 114 and the emergency power interrupt, "slam button" switch 115. The on/off switching circuitry may include a push button mechanism 114 with colored light indicating the powered up or powered down status of the machine, meaning whether or not the hydraulic power source 121 is circulating hydraulic fluid in the respective hydraulic loops for advancing and retracting the shear blade and for raising and lowering the jacking platform. Electrical power for actuating the solenoid actuated, pneumatic valve array 136 and the pneumatic valve 139 closing and opening the access port 116 may also be supplied via the on/off switch 114.

On the other hand, the circuitry for emergency power interrupt (EPO) "slam button" switch 115 may include means for maintaining electrical power to certain of the actuating elements system in the event of machine malfunction to insure that it "fails safe." For, example, it may be desirable to maintain circulation in the hydraulic loop for the long thrust hydraulic cylinder 53 to allow retraction only of the shear blade. Also if the access door 116 is closed, it maybe desirable to maintain that closed status. On the other hand, if the access port 116 is not closed or will not close because debris or an operator's hand is caught between the descending door and the base of the frame 12, it would be desirable for the EPO circuitry, to switch the status the solenoid actuated pneumatic valve 139 from directing air pressure for closing the access door 116 to raising and opening it.

The invented machine for shearing components from the surface of printed circuit boards has been described in context of preferred and suggested embodiments. Many modifications and variations can be made to the invented machine, which while not exactly described herein, fall within the spirit and the scope of invention as described and set forth in the appended claims.

I claim:

1. A machine for shearing circuit components from component studded surfaces of printed circuit boards, comprising, in combination:
   a rigid shear frame, and:
   (a) a carriage slideable on inclined parallel rails secured to the rigid shear frame carrying a shear blade having a chiseling edge lying in a shear plane;
   (b) driving means secured between the rigid shear frame and the carriage for reciprocating the carriage sliding on the inclined parallel rails, the chiseling edge of the shear blade moving across the shear plane within a throat region of the shear frame as the carriage is reciprocated;
   (c) a jacking platform secured to the rigid shear frame providing a fiat support surface moveable perpendicularly relative to the shear plane for supporting and positioning the printed circuit board with its component studded surface up and aligned in the shear plane;
   (d) an anvil secured to the rigid shear frame for capturing an edge of and supporting the printed circuit board laid, component side up, on the support surface of the jacking platform against thrust of the shear blade chiseling components off its surface;
   (e) a plurality of clamping means mechanically coupled to the rigid shear frame oriented in a clamping array above the jacking platform for clamping the printed circuit board against the support surface of the jacking platform; and
   (f) jacking means mechanically coupling between the rigid shear frame and the jacking platform for reciprocating the jacking platform toward and away from the shear plane.

2. The machine of claim 1 further including a hexahedral housing frame supporting the rigid shear frame inclined at an angle relative to a supporting, horizontal floor surface.

3. The machine of claim 2 wherein the rigid shear frame is rectangular and has a base bar at a lower end, and a yoke bar at a higher end and at least two longitudinal side bars joining the base and yoke bars.

4. The machine of claim 3 wherein the base bar and the yoke bar of the shear frame are parallel to the supporting horizontal floor surface.

5. The machine of claim 4 and further including a hexahedral box frame secured to the side bars of the shear frame structurally stiffening the shear frame against torque loads tending to flex the side bars of the shear frame.

6. The machine of claim 5 wherein the clamping means are mechanically coupled to the rigid shear frame by a clamping frame cantilevered from the hexahedral box frame, the clamping frame supporting the array of clamping means above a throat region of the rectangular shear frame located over the jacking platform between longitudinal side bars proximate the base bar at the lower end of the rectangular shear frame and the chiseling edge of the shear blade when the carriage is retracted upward toward the higher end of the rectangular shear frame.

7. The machine of claim 6 further including a jacking bed supported underneath the throat region of the shear frame by a plurality of hangers coupling between the shear frame and the jacking bed, and wherein the jacking means are anchored on the jacking bed and support and reciprocate the jacking platform above the jacking bed.

8. The machine of claim 7 wherein the anvil is secured to the base bar of the rectangular shear frame establishing the base of the throat region of the shear frame.

9. The machine of claim 8 wherein the carriage is located between the side bars of the rectangular shear frame engaging and sliding on two parallel rails, each secured to a side bar of the shear frame, whereby, the chiseling edge of the shear blade carried by the carriage sweeps across the shear plane within the throat region of the shear frame as the carriage as is driven longitudinally down the inclined shear frame between the side bars by the driving means.

10. The machine of claim 9 wherein the driving means is secured and supported between the carriage and the yoke bar of the rectangular shear frame.

11. The machine of claim 1 or 10 wherein forces acting on the carriage include forces due to the driving means translating the carriage down the parallel rails and forces due to resistance encountered by the chiseling edge of the shear blade resisting such translation, and wherein the carriage has slideway channels receiving and sliding along parallel rails located for providing a resultant force vector of the forces acting on the carriage which is aligned parallel to and in a plane bisecting the inclined parallel rails.

12. The machine of claim 11 wherein the slideway channels of the carriage are lined with a fluorocarbon resin and elastomer bearing material which exhibits lubricating properties under conditions of high compression, and wherein such fluorocarbon resin and elastomer bearing material is compressed to provide lubrication when the carriage is mounted for sliding between the parallel rails.

13. The machine of claim 12 wherein there are at least two parallel rails, and wherein the carriage comprises, in combination, (g) a rectangular carriage plate with a top and a bottom surface with slideway channels located along each of its respective, opposite, longitudinal side edges, the rectangular plate being located between and slideable longitudinally up and down the parallel rails, (h) means for securing the shear blade to a front edge of the rectangular carriage plate with the chiseling edge oriented perpendicularly with respect to the parallel rails, and spaced below the bottom surface of the carriage plate, and (i) a rod yoke coupling securing the carriage plate to the driving means.

14. The machine of claim 13 wherein the shear blade has an inclined front surface, a flat top seating surface, a flat back seating surface essentially perpendicular to its top seating surface, and wherein the means for securing the shear blade to a front edge of the rectangular carriage plate includes an 'L-shaped' relief cut into the front edge and the bottom surface of the rectangular carriage plate for receiving and engaging the top and back seating surfaces of the shear blade.

15. The machine of clam 14 wherein the front edge of the rectangular carnage plate has an inclined front surface aligned with the inclined front surface of the shear blade.

16. The machine of claim 15 wherein the front surface of the shear blade is inclined at an acute angle ranging from 20° to 45° relative to the shear plane.

17. The machine of claim 16 wherein the shear blade has a planer bottom surface between its chiseling edge and back seating surface raked at a slight angle ranging between 0.05° and 1.5° relative to the shear plane, whereby, the shear plane is spaced below the bottom surface of the carriage plate.

18. The machine of claim 16 wherein the shear blade has a planer bottom surface parallel to its top seating surface and essentially perpendicular to its back seating surface, and wherein the 'L-shaped' relief cut into the front edge and the bottom surface of the rectangular carriage plate for receiving and engaging the top and back seating surfaces of the shear blade is oriented to rake the bottom planer surface of the shear blade at a slight angle ranging between 0.05° and 1.5° relative to the shear plane, whereby, the shear plane is spaced below the bottom surface of the carriage plate.

19. The machine of claim 16 wherein the shear blade has a stepped bottom surface between its chiseling edge and its back seating surface creating a planer foot surface extending from the chiseling edge of the blade to the step lying in the shear plane, and a shank surface extending from the step to the back seating surface above the shear plane, whereby, the shear plane is spaced below the bottom surface of the carriage plate.

20. The machine of claim 16 wherein the parallel rails have a rectangular cross sections, and wherein the slideway channels are defined by a combination of:

(j) an 'L-shaped' relief cut into the top surface and into the respective longitudinal side edges of the rectangular carriage plate, and (k) at least two 'L-shaped' clamping bars; and (l) means for securing each 'L-shaped' clamping bar to the top surface of the carriage immediately adjacent an 'L-shaped' relief, whereby, at least two rectangular 'U-shaped' channels are defined along the respective longitudinal side edges of the carriage plate dimensioned for and receiving the parallel rails.

21. The machine of claim 1 or 10 wherein the anvil includes an anvil face oriented perpendicularly with respect to the shear plane having a horizontal rectangular groove cut into the anvil face coinciding with the shear plane for receiving and capturing an edge of a printed circuit board on the support surface of the jacking platform.

22. The machine of claim 21 further including a plurality of 'U-shaped' debris slots aligned perpendicularly to the horizontal rectangular groove cut into the face of the anvil defining a plurality of anvil fingers each with an anvil face perpendicular to the shear plane having a horizontal rectangular groove aligned in the shear plane for receiving, capturing, and supporting a portion of the edge of the printed circuit board on the support surface of the jacking platform, whereby, a plurality of 'U-shaped' debris channels are provided at the base of the throat region of the machine for receiving and directing circuit components sheared from the surface of the circuit board into a collection receptacle located below the throat region of the machine.

23. The machine of claim 7 wherein the jacking means comprises, (m) a jacking hydraulic cylinder secured between the jacking bed and the jacking platform having:

(i) a cylinder for containing a hydraulic liquid with a bottom end seated on and secured to the jacking bed, and a top end extending toward the jacking platform;

(ii) a piston translating within the interior of the cylinder dividing its interior volume into an upper and a lower chamber;

(iii) an upper port hydraulically communicating with the upper chamber, and a lower port hydraulically communicating with the lower chamber;

(iv) a working rod extending out the top end of the cylinder coupling between the jacking platform and the piston within the interior of the cylinder; and (v) sealing means disposed between the top end the cylinder and the rod for confining the hydraulic liquid within upper chamber of the cylinder;

and further including:

(n) a source of hydraulic power for circulating a hydraulic liquid; and (o) jacking control valve means hydraulically connecting the ports of the jacking hydraulic cylinder to the source of hydraulic power for controlling input and exhaust of hydraulic liquid from the upper and lower chambers of the hydraulic cylinder respectively translating the piston longitudinally within the interior volume of the cylinder, whereby, the jacking platform may be elevated and lowered with respect to the shear plane.

24. The machine of claim 23 wherein the jacking hydraulic cylinder further includes:

(vi) a displacement rod extending out the bottom end of the cylinder coupled to the piston which has a cross section area identical to that of the working rod, whereby, the working rod and the displacement rod displace equal volumes per unit length; and (vii) sealing means disposed between the bottom end of the cylinder and the displacement rod for confining the hydraulic liquid within lower chamber of the cylinder; and wherein the jacking bed includes a hole drilled through its supporting bed for allowing the displacement rod to extend through it.

25. The machine of claim 24 wherein there are at least three identical jacking hydraulic cylinders, located for symmetrically supporting the jacking platform above the jacking bed and below the shear plane, with the bottom ends of the cylinders fastened to the jacking bed and with the working rods fastened to the jacking platform and;

and wherein:

(viii) the upper port of a first jacking hydraulic cylinder is hydraulically coupled to the jacking control valve means, and (ix) the lower port of the first jacking cylinder is hydraulically coupled to the upper port of a second jacking hydraulic cylinder, and (x) the lower port of the second jacking cylinder is hydraulically coupled to the upper port of a third jacking hydraulic cylinder, and (xi) the lower port of the third jacking hydraulic cylinder is hydraulically coupled to the jacking control valve means, whereby, the jacking platform can be elevated and lowered while maintaining planer orientation of its support surface relative to the shear plane by respectively, circulating and oppositely circulating unit volumes of hydraulic liquid using the jacking control valve means into and through the hydraulically coupled jacking hydraulic cylinders.

26. The machine of claim 25 and further including a fourth identical jacking hydraulic cylinder between the third jacking hydraulic cylinder and the jacking control valve means with its upper port hydraulically coupled to the lower port of the third jacking hydraulic cylinder and its lower port hydraulically coupled to the jacking control valve means, the four jacking hydraulic cylinder being symmetrically located, each supporting a quadrant section of the jacking platform.

27. The machine of claim 26 further including means for adjusting elevation of the jacking bed below the shear plane, and wherein the elevation of the jacking bed below the shear plane is always greater than a maximum height to which the support surface of the jacking platform supported by the working rods of the hydraulic cylinders can be elevated above the jacking bed by a distance at least equal to a minimum expected thickness of the printed circuit boards having components to be sheared from their surfaces, whereby, engagement of the shear blade and the jacking platform is precluded.

28. The machine of claim 27 wherein the means for adjusting elevation of the jacking bed below the shear plane comprise the plurality of hangers coupling between the shear frame and the jacking bed, which include, in combination, (p) at least three helically threaded hanger bolts coupling between the shear frame and the jacking bed supporting the jacking bed underneath the throat region of the machine, (q) helically threaded nuts screwing onto the helically threaded hanger bolts, and (r) a helical compression spring disposed around each of the hanger bolts for providing a force tending to separate the jacking bed and shear frame, whereby, the elevation and angular orientation of the shear bed below the shear plane can be adjusted by turning the threaded nuts on the hanger bolts.

29. The machine of claim 25 wherein each jacking hydraulic cylinder includes at least one bleed valve hydraulically communicating with the upper chamber through which hydraulic liquid can be introduced into and exhausted from the respective hydraulically coupled chambers of the jacking hydraulic cylinders, whereby, the angular orientation of the flat support surface of the jacking platform can be adjusted with respect to the shear plane, and, whereby, gas entrapped in the hydraulically coupled chambers can be exhausted.

30. The machine of claim 29 wherein the flat support surface of the jacking platform is oriented parallel to the shear plane.

31. The machine of claim 6 or 25 wherein the array of clamping means comprises, in combination, (s) a plurality of cross frame members supported and secured by the clamping frame cantilevered over the throat region of the shear frame;

(t) a plurality of normally retracted pneumatic cylinders each having an extendible rod with a engagement head secured at a distal end, supported and oriented in an array by the plurality of cross frame members such that the extendible rods extend perpendicularly toward the shear plane;
(u) a source of pressurized gas;
(v) clamping control valve means connecting between the source of pressurized gas and each of the pneumatic cylinders for extending and retracting their respective extendible rods.

32. The machine of claim 31 wherein the engagement head secured to the distal end of the extendible rod of each pneumatic cylinder pivots about two orthogonal axes perpendicular to extendible rod.

33. The machine of claim 32 and further including at least two additional normally retracted pneumatic cylinders with extendible rods, supported by a cross frame member of the clamping frame above the throat region adjacent the anvil, and a clamping bar secured at the distal ends of extendible rods of additional pneumatic cylinders, the additional pneumatic cylinders being connected via clamping control valve means to the source of pressurized gas for driving the clamping bar downward to engage the component studded surface of printed circuit boards supported within the throat region of the shear frame adjacent the anvil responsive and for retracting the clamping bar upward.

34. The machine of claim 32 and further including a plurality of proximity switching means secured to and located adjacent the throat region of the shear frame sensing the position of the carriage sliding on the inclined rails for triggering the clamping control valve means to retract an extendible rod of a pneumatic cylinder upward releasing engagement with the component studded surface of the printed circuit board as the chiseling edge of the shear blade moves into proximity of the engagement head secured at the distal end of the extendible rod.

35. The machine of claim 31 wherein the cross frame members supported and secured by the clamping frame are oriented perpendicularly with respect to the side bars of the shear frame, and each normally retracted pneumatic cylinder hangs from a cross frame member, pivoting about an axis aligned with the particular supporting cross frame member, and
further including resilient springs orienting the pneumatic cylinders with their respective extension axes perpendicular to the shear plane.

36. The machine of claim 35 wherein positions at which the respective pneumatic cylinders hang from a particular cross frame member can be adjusted allowing the clamping array to be adjusted for optimally clamping a printed circuit board with a particular configuration of components studding its surface to the support surface of the jacking platform.

37. The machine of claim 4 or 25 wherein the driving means translating the carriage up and down on the inclined parallel rails comprises a long thrust, double action hydraulic cylinder with its extension axis aligned parallel to the side bars of the shear frame and having:
(i) a cylinder for containing a hydraulic liquid,
(ii) a yoke securing the cylinder to the yoke bar of the shear frame,
(iii) a piston translating within the interior of the cylinder dividing its interior volume into two chambers each with a separate port;
(iv) a driving rod extending from a distal end of the cylinder coupling between the carriage and the translating piston within the interior of the cylinder, and
(v) sealing means disposed between the distal end of the cylinder and the rod for confining the hydraulic liquid within that chamber of the cylinder; and further including:
(w) driving control valve means hydraulically connecting the ports of the long thrust, double action hydraulic cylinder to a source of hydraulic power for circulating the hydraulic liquid into the respective chambers for extending the driving rod, sliding the carriage carrying the shear blade down the shear plane for shearing components from the component studded surface of the printed circuit board, and for reversing circulation of the hydraulic liquid into the respective chambers for retracting the carriage back up the shear plane.

38. The machine of claim 37 and further including adjustable flow restricting means for regulating rate of hydraulic liquid flow from the particular chamber of the long thrust, hydraulic cylinder, for controlling rate of translation of the carriage as it is driven down the shear plane, sliding on the inclined rails, shearing components from the surface of a printed circuit board.

39. The machine of claim 38 and further including a check valve hydraulically connected in parallel with the adjustable flow restricting means for bypassing the adjustable flow restricting means upon reversing circulation of the hydraulic liquid into the respective chambers of the long thrust, hydraulic cylinder for retracting the carriage back up the shear plane, whereby, the carriage retracts back up the shear plane sliding on the inclined rails at a maximum rate.

40. A machine for shearing circuit components from printed circuit boards comprising, in combination, a rigid frame, and:
(a) a carriage slideable on two inclined parallel rails secured to the rigid shear frame carrying a shear blade with a linear chiseling edge lying in a shear plane;
(b) a jacking platform secured to the rigid shear frame providing a flat support surface parallel the rails moveable perpendicularly relative to the shear plane for supporting and positioning a component studded surface of the printed circuit board in the shear plane aligned with the linear chiseling edge of the shear blade;
(c) an anvil secured to the rigid shear frame for capturing an edge of and supporting the printed circuit board laid, component side up, on the support surface of the jacking platform against thrust of the shear blade chiseling components off its surface;
(d) a plurality of normally retracted, pneumatically energized, clamping cylinders each having an extendible rod with a engagement head secured at its distal end, supported and oriented in a clamping array mechanically coupled to the rigid shear frame above the jacking platform for clamping the printed circuit board against the support surface of the jacking platform;
(e) a long thrust, double action hydraulic cylinder secured between the rigid shear frame and the carriage for reciprocating the carriage sliding on the inclined parallel rails; and
(f) at least three identical single piston, double-rod, jacking hydraulic cylinders mechanically coupling the rigid shear frame to the jacking platform for reciprocating the jacking platform, the jacking hydraulic cylinders being hydraulically coupled for maintaining the support surface of the platform parallel to the shear plane, and a source of hydraulic power circulating a hydraulic liquid;

a source of pressurized gas;

jacking control valve means hydraulically connecting the jacking hydraulic cylinders to the source of hydraulic power for elevating and lowering jacking platform with respect to the shear plane;

driving control valve means hydraulically connecting the long thrust, double action hydraulic cylinder reciprocating the carriage sliding on the inclined parallel rails to the source of hydraulic power for sliding the carriage down and up the inclined parallel rails; and clamping control valve means pneumatically connecting between the source of pressurized gas and each of the pneumatic cylinders for extending and retracting their respective extendible rods.

41. The machine of claim 1 or 40 and further including a hexahedral housing frame supporting the rigid shear frame inclined at an angle relative to a supporting, horizontal floor surface, and wherein the chiseling edge of the shear blade moves across the shear plane within a working throat region of the machine as the carriage is reciprocated, sliding on the inclined parallel rails, and wherein the rigid shear frame includes integral clamping framework members supporting the clamping array above the shear plane within the working throat region, and a stationary jacking bed hanging below the shear plane supporting the jacking platform below the shear plane in the working throat, and further including protective shields secured to the rigid shear frame structure and clamping framework members enclosing the working throat of the machine above the shear plane.

42. The machine of claim 41 wherein the protective shields enclosing the working throat region of the machine include an access door movable in a frame supported at a top end by the clamping framework members and at a base end by the rigid shear frame for allowing access into the working throat of the machine above the shear plane.

43. The machine of claim 42 wherein the access door is located on a side of the working throat region of the machine opposite the carriage.

44. The machine of claim 43 wherein the access door translates from a closed position at the base end of its frame to an open position at the top end of its frame to allow access into the throat region of the machine, and further including door opening means for translating the access door from the base end to the top end of its frame.

45. The machine of claim 44 wherein the door opening means comprises, in combination, a door pneumatic cylinder mechanically coupled to a clamping framework member above the access door and having an extending and retracting rod mechanically coupled to the access door for raising and lowering the access door, and a solenoid control valve pneumatically connecting between a source of pressurized gas and the door pneumatic cylinder for extending and retracting its rod opening and closing the access door responsive to electrical power, and further including a safety interlock system comprising, in combination;

a sensor means for sensing open status and closed status of the access door and providing an open-door-status signal and a closed-door-status signal, and a manually actuated control having:
(i) a toggling switching means for providing electrical power to the solenoid control valve means closing the access door in a toggle-down position, and opening the access door in a toggle-up position;
(ii) a normally-open proximity switch for enabling operation of the clamping array upon closing and for disabling operation of the clamping array upon opening; and
(iii) a peddle member, spring biased in an up position, manually movable to a down position, mechanically engaging and switching the toggling switch means from the toggle-up to the toggle-down position as it moves from the up position to the down position and mechanically closing the normally open proximity switch in the down position, interlocking means receiving the open-door-status and closed-door-status signals from the sensor means for preventing operation of the clamping array responsive to an open door status signal, whereby, (i) manually moving the peddle member from the peddle up to the peddle position first activates the door pneumatic actuator for closing the access door and then enables operation of the clamping array if and only if the access door is actually closed, (ii) manually releasing the peddle member held in the down position allows it to move to its spring biased up position first disabling operation of the clamping array causing it to release engagement of the printed circuit board and then activates the door pneumatic actuator for opening the access door, and (iii) the access door is always closed when the clamping array is operational.

* * * * *